(12) United States Patent (10) Patent No.: US 12,638,507 B2
Hamakubo et al. (45) Date of Patent: May 26, 2026

(54) AUTOMATIC DOOR MAINTENANCE SUPPORT SYSTEM, AUTOMATIC DOOR MAINTENANCE SUPPORT APPARATUS, AUTOMATIC DOOR APPARATUS, AUTOMATIC DOOR MAINTENANCE SUPPORT METHOD, AND PROGRAM

(71) Applicant: NABTESCO CORPORATION, Tokyo (JP)

(72) Inventors: Tomohiro Hamakubo, Tokyo (JP); Yoshinari Kiyomasa, Tokyo (JP); Daisuke Kimachi, Tokyo (JP)

(73) Assignee: NABTESCO CORPORATION, Tokyo (JP)

( * ) Notice: Subject to any disclaimer, the term of this patent is extended or adjusted under 35 U.S.C. 154(b) by 390 days.

(21) Appl. No.: 17/123,864

(22) Filed: Dec. 16, 2020

(65) Prior Publication Data

US 2021/0102999 A1 Apr. 8, 2021

Related U.S. Application Data

(63) Continuation of application No. PCT/JP2019/030181, filed on Aug. 1, 2019.

(30) Foreign Application Priority Data

Aug. 9, 2018 (JP) ................................ 2018-150827
Nov. 28, 2018 (JP) ................................ 2018-222679

(51) Int. Cl.
*G01R 31/34* (2020.01)
*E05F 15/632* (2015.01)
(Continued)

(52) U.S. Cl.
CPC .......... *G01R 31/343* (2013.01); *E05F 15/632* (2015.01); *E05F 15/70* (2015.01);
(Continued)

(58) Field of Classification Search
CPC ........ G01R 31/343; G05B 23/02; G07C 3/00; E05F 15/632; E05F 15/70;
(Continued)

(56) References Cited

U.S. PATENT DOCUMENTS 5,587,565 A * 12/1996 Schroder-Brumloop ...................
G05B 19/416
187/394
6,392,537 B1 * 5/2002 Tazumi ................. B66B 5/0006
49/31
(Continued)

FOREIGN PATENT DOCUMENTS

JP H09100678 A 4/1997
JP 2002218083 A 8/2002
(Continued)

OTHER PUBLICATIONS

English Abstract of KR 100733622, Jun. 28, 2007. (Year: 2007).*
(Continued)

*Primary Examiner* — Michael P Nghiem
(74) *Attorney, Agent, or Firm* — CANTOR COLBURN LLP

(57) ABSTRACT

An automatic door maintenance support system includes an acquirer that acquires state information of a motor which drives a door of an automatic door in a first speed control state in which the door is maintained at a predetermined first speed, and a specifier that specifies information regarding maintenance of the automatic door by comparing the acquired state information with a predetermined reference value. An automatic door maintenance support method includes a step of acquiring state information of a motor which drives a door of an automatic door in a speed control state in which the door is maintained at a predetermined speed, and a step of specifying information regarding main-
(Continued)

tenance of the automatic door by comparing the acquired state information with a predetermined reference value.

20 Claims, 10 Drawing Sheets

(51) Int. Cl.
| | |
|---|---|
| *E05F 15/70* | (2015.01) |
| *G05B 23/02* | (2006.01) |
| *G07C 3/00* | (2006.01) |

(52) U.S. Cl.
CPC .............. *G05B 23/02* (2013.01); *G07C 3/00* (2013.01); *E05Y 2201/434* (2013.01); *E05Y 2201/652* (2013.01); *E05Y 2400/45* (2013.01); *E05Y 2900/132* (2013.01)

(58) Field of Classification Search
CPC ......... E05Y 2201/434; E05Y 2201/652; E05Y 2400/45; E05Y 2900/132
USPC ........................................................ 702/113
See application file for complete search history.

(56) References Cited

U.S. PATENT DOCUMENTS

| | | | | |
|---|---|---|---|---|
| 2004/0049319 A1* | 3/2004 | Kanki | ................ | G05B 23/0272 |
| | | | | 700/275 |
| 2015/0059989 A1* | 3/2015 | Gutierrez | .................. | E06B 9/82 |
| | | | | 160/405 |
| 2018/0130198 A1* | 5/2018 | Kikuchi | .................... | G06T 7/90 |
| 2020/0071983 A1* | 3/2020 | Ottmann | ................ | E05F 15/73 |
| 2020/0074770 A1* | 3/2020 | Piewek | ................ | G07C 5/0841 |

FOREIGN PATENT DOCUMENTS

| | | | |
|---|---|---|---|
| JP | 2004094982 A | * | 3/2004 |
| JP | 2005307613 A | | 11/2005 |
| JP | 2007262653 A | | 10/2007 |
| JP | 2014056509 A | | 3/2014 |
| JP | 2017163806 A | | 9/2017 |

OTHER PUBLICATIONS

English translation of JP 2004094982, Mar. 25, 2004. (Year: 2004).*
English Abstract of JP 9-100678, Apr. 15, 1997. (Year: 1997).*
CNIPA Decision of Rejection for corresponding CN Application No. 201980039684.7; Issued on Jul. 11, 2022.
CNIPA First Office Action for corresponding CN Application No. 2019800396847; Issued on Oct. 9, 2021.
International Search Report for International Application No. PCT/JP2019/030181; Date of Mailing Oct. 15, 2019.
PCT International Preliminary Report on Patentability with Written Opinion of the International Searching Authority for International Application No. PCT/JP2019/030181; Date of Mailing, Oct. 15, 2019.
JPO Notification of Reason(s) for Refusal for corresponding JP Application No. 2018-150827; Mail date of Apr. 12, 2022.
JPO Notification of Reason(s) for Refusal for corresponding JP Application No. 2018-222679; Mailing Date, Nov. 1, 2022.
Canadian Office Action corresponding to JP Application No. 2019-030181; Mailing Date, Nov. 7, 2022.
JP Notification of Reason for Refusal corresponding to JP Application No. 2018-150827; Mailing Date, Sep. 20, 2022.
CNIPA 2nd Office Action for corresponding CN Application No. 201980039684.7; Issued on Mar. 21, 2022.
Canadian Office Action for corresponding CA Application No. 3,104,046; Dated on Feb. 23, 2022.
JPO Decision of Refusal for corresponding JP Application No. 2018-150827; Mailing Date, Feb. 21, 2023.
JPO Decision of Refusal for corresponding JP Application No. 2018-222679; Mailed on Apr. 25, 2023.
SIPO Petition for Reexamination for corresponding CN Application No. 201980039684.7 issued Oct. 21, 2025.
Wen et al. "Hotel Management and Practice"; Published Jan. 1, 2014; Barcode: 9787304056162; 978-7-304-05616-2; 8 pages. (English translation thereof.).

* cited by examiner

AUTOMATIC DOOR MAINTENANCE SUPPORT SYSTEM, AUTOMATIC DOOR MAINTENANCE SUPPORT APPARATUS, AUTOMATIC DOOR APPARATUS, AUTOMATIC DOOR MAINTENANCE SUPPORT METHOD, AND PROGRAM

CROSS REFERENCE TO PRIOR APPLICATIONS

This application is a continuation under 35 U.S.C. § 120 of PCT/JP2019/030181, filed Aug. 1, 2019, which is incorporated herein reference and which claimed priority to Japanese Application No. 2018-150827, filed Aug. 9, 2018 and Japanese Application No. 2018-222679, filed Nov. 28, 2018. The present application likewise claims priority under 35 U.S.C. § 119 to Japanese Application No. 2018-150827, filed Aug. 9, 2018 and Japanese Application No. 2018-222679, filed Nov. 28, 2018, the entire content of which is also incorporated herein by reference.

BACKGROUND OF THE INVENTION

1. Field of the Invention

The present invention relates to an automatic door maintenance support system, an automatic door maintenance support apparatus, an automatic door apparatus, an automatic door maintenance support method, and a program.

2. Description of the Related Art

In an automatic door that automatically opens and closes a door at an opening of a building, a failure may occur due to deterioration of a part due to aging, and thus, it is desirable that maintenance is performed before the failure occurs. However, an appropriate maintenance point in time differs greatly depending on individual apparatuses due to a usage frequency, variation in parts, and the like.

JP 2014-056509 A describes a monitoring device that monitors an apparatus that is continuously used for a long period of time such as a manufacturing apparatus in order to suppress an excessive notification. This monitoring device acquires a physical quantity indicating a state of the manufacturing apparatus to be monitored, and determines whether or not an abnormality occurs based on the physical quantity.

JP 2014-056509 A describes a method of monitoring whether or not there is an abnormality appearing as a sign of a failure which will occur in the future in a mold temperature controlling machine or a robot which is an apparatus to be monitored based on a physical quantity indicating the state of each apparatus. In this method, an abnormality notification is performed by displaying, on a graph, abnormal waveforms representing time changes of a current value and vibration supplied to the apparatus to be monitored for a predetermined time. However, the disclosed contents of JP 2014-056509 A is ambiguous, and it cannot be said that contents sufficient for accurately diagnosing the abnormality of the apparatus to be monitored are disclosed.

Thus, the present inventor has recognized that there is room for improvement in the related art from the viewpoint of accurately diagnosing an abnormality of an automatic door including a plurality of components.

SUMMARY OF THE INVENTION

The present invention has been made in view of these problems, and an object of the present invention is to provide an automatic door maintenance support technology capable of accurately diagnosing abnormalities of an automatic door and components thereof.

In order to solve the problems, an automatic door maintenance support system of an aspect of the present invention includes an acquirer that acquires state information of a motor which drives a door of an automatic door in at least any one control state of an acceleration control state in which the door is accelerated to a predetermined first speed, a first speed control state in which the door is maintained at the first speed, a deceleration control state in which the door is decelerated to a second speed less than the first speed, and a second speed control state in which the door is maintained at the second speed, and a specifier that specifies information regarding maintenance of the automatic door by comparing the acquired state information of the motor with a predetermined reference value.

According to this aspect, the information regarding the maintenance of the automatic door can be specified based on the reference value.

Any combination and an example in which components or expressions of the present invention are replaced with each other between a method, an apparatus, a program, a temporary or non-temporary storage medium recording the program, a system, and the like is effective as an aspect of the present invention.

DETAILED DESCRIPTION OF THE INVENTION

Figure 1:
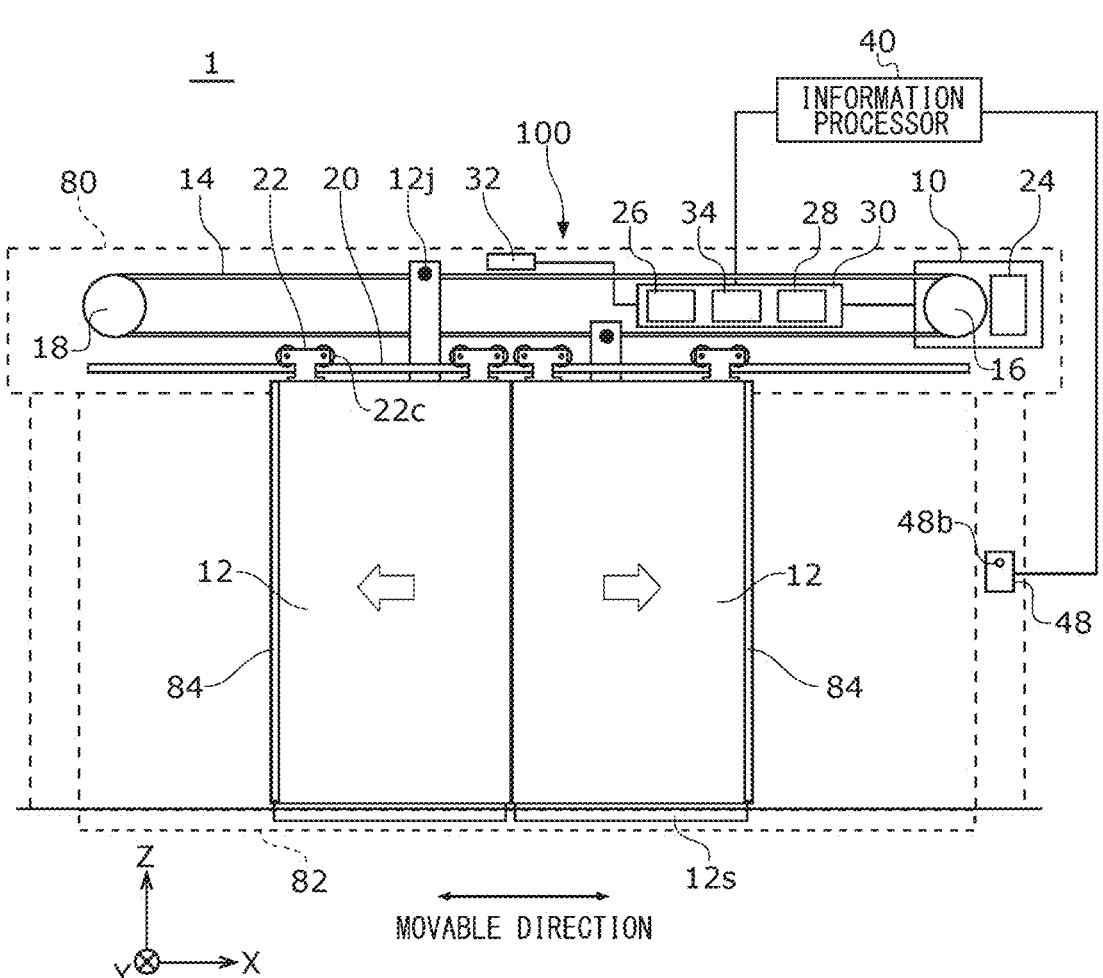
FIG. 1 is a front view schematically illustrating an automatic door to which an automatic door maintenance support system according to a first embodiment is applied.

The invention will now be described by reference to the preferred embodiments. This does not intend to limit the scope of the present invention, but to exemplify the invention.

First, an outline of the present invention will be described. An aspect of the present invention is an automatic door maintenance support system. This automatic door maintenance support system includes an acquirer that acquires information regarding a state of a motor which drives a door of an automatic door (hereinafter, referred to as "state information") in at least any one control state of an acceleration region (acceleration control state) in which the door is accelerated to a predetermined first speed, a high speed region (first speed control state) in which the door is maintained at the first speed, a deceleration region (deceleration control state) in which the door is decelerated to a second speed less than the first speed, and a low speed region (second speed control state) in which the door is maintained at the second speed, and a specifier that specifies information regarding maintenance of the automatic door by comparing the acquired state information of the motor with a predetermined reference value. This system may support maintenance of one or a plurality of automatic doors. The predetermined first speed may be a relatively high speed after the door is accelerated. The state information of the motor may be an electrical value of the motor, or may include information regarding a load of the motor.

The state information of the motor may be acquired at a plurality of timings in at least any one control state of the acceleration region, the high speed region, the deceleration region, and the low speed region. In this case, since the evaluation is performed not at one point but at a plurality of points in the speed region, various kinds of information can be obtained at multiple points like a case where power consumption of the motor is obtained from a motor voltage. As an example, the plurality of timings may be an intermediate timing of each speed region and a switching timing between the speed regions.

According to this aspect, since the state information of the motor in each speed region (each control state) is used, accuracy of state diagnosis and prediction of necessity for maintenance of the automatic door and the components thereof can be improved compared to a case where a failure is simply diagnosed from the number of times of opening and closing, the number of errors, an operation time, and the like. In particular, a large additional apparatus cannot be used by using the state information of the motor, and a location at which a condition deteriorates can be found by acquiring state changes of a drive system and an electric system. The state information can also be applied to level evaluation of maintenance necessity. The state information of the motor can also be used to determine whether a construction situation of the automatic door such as excessive tension of a belt is good or bad.

The state information of the motor may be acquired at the time of switching between control states of the acceleration region, the high speed region, the deceleration region, and the low speed region. In this case, an acquisition timing becomes constant by acquiring the state information at the time of switching, and an error due to a fluctuation in the acquisition timing can be suppressed. Since the information is acquired at the time of switching, the amount of information becomes more compact than in the case of constantly acquiring information, and storing and processing thereof become easier.

The reference value may be set or updated according to state information of the motor acquired in the past. In this case, since the reference value is set based on the state information of the motor of the particular automatic door, it is hard to be influenced by an individual performance difference (variation at the time of manufacturing) of the automatic door. For example, when an initial acquisition value is used as the reference value, the information can be acquired as a change for an initial value. The reference value is appropriately updated, and thus, it is possible to eliminate the influence of variations due to environmental fluctuations such as summer and winter.

The system may include a presenter that presents the state information of the automatic door. The state information of the automatic door is presented, and thus, a service technician and an operator of a management center can easily grasp a state of the automatic door.

The state information of the motor may include at least one state information of a voltage, a current, a rotational speed, vibration, and a temperature of the motor. In this case, the state information of the automatic door can be specified from the state information of the voltage, current, rotational speed, vibration, and temperature of the motor.

The specifier may classify the acquired state information of the motor based on a threshold value. In this case, the state of the motor can be accurately determined by classifying the state information according to the threshold value and using the classification result. For example, the threshold value may be a limit value for which replacement is recommended when the threshold value exceeds the threshold value.

Another aspect of the present invention is an automatic door maintenance support apparatus. This apparatus includes an acquirer that acquires state information of a motor which drives a door of an automatic door in at least any one control state of an acceleration control state in which the door is accelerated to a first speed, a first speed control state in which the door is maintained at the first speed, a deceleration control state in which the door is decelerated to a second speed less than the first speed, and a second speed control state in which the door is maintained at the second speed, and an output unit that outputs the acquired state information of the motor. For example, the automatic door maintenance support apparatus may acquire the state information from the motor of the automatic door, and may output the acquisition result from the output unit to the management center. In this case, the management center can specify the necessity for the maintenance of the automatic door by analyzing the acquisition result. The output unit may output the acquisition result to a predetermined memory, and may store the acquisition result in this memory. In this case, the service technician can determine the necessity for the maintenance of the automatic door from the storage result of the memory.

Still another aspect of the present invention is a maintenance support method of an automatic door. This method includes a step of acquiring state information of a motor which drives a door of an automatic door by using a sensor in at least any one control state of an acceleration control state in which the door is accelerated to a first speed, a first speed control state in which the door is maintained at the first speed, a deceleration control state in which the door is decelerated to a second speed less than the first speed, and a second speed control state in which the door is maintained at the second speed; and a step of specifying information regarding maintenance of the automatic door by comparing the acquired state information of the motor with a predetermined reference value. According to this aspect, since the state information of the motor in each speed region is used, accuracy of state diagnosis and prediction of necessity for maintenance of the automatic door and the components thereof can be improved compared to a case where a failure is simply diagnosed from the number of times of opening and closing and the like.

Still another aspect of the present invention is a maintenance support method of an automatic door. This method includes a process of monitoring a behavior of an electrical value regarding a motor which drives a door of an automatic door in at least any one control state of an acceleration control state in which the door is accelerated to a first speed, a first speed control state in which the door is maintained at the first speed, a deceleration control state in which the door is decelerated to a second speed less than the first speed, and a second speed control state in which the door is maintained at the second speed, and a process of specifying state information regarding maintenance of the automatic door based on the behavior. According to this aspect, since the electrical value regarding the motor in each control state (speed region) is used, accuracy of state diagnosis and prediction of necessity for maintenance of the automatic door and the components thereof can be improved compared to a case where a failure is simply diagnosed from the number of times of opening and closing and the like. For example, the electrical value regarding the motor may include any of the voltage, current, rotational speed, vibration, and temperature of the motor.

The state information of the motor may be the electrical value corresponding to the state of the motor. As an example, this electrical value may be a torque of the motor, power consumption of the motor, a drive current of the motor (hereinafter, simply referred to as a "current"), a drive voltage of the motor, or the like. The predetermined reference value may be a reference value set at the time of installation or maintenance of the automatic door, or may be a reference value updated and set at a predetermined point in time or when a predetermined event occurs.

According to this aspect, since the state information is used, accuracy of state diagnosis and prediction of necessity for maintenance of the automatic door and the components thereof can be improved compared to a case where a failure is simply diagnosed from the number of times of opening and closing and the like. According to this aspect, it is possible to estimate a state of wear, deformation, deterioration, adhesion of dirt or the like of the component of the automatic door. Examples of the component include a door roller of the automatic door, a traveling rail at which the door roller travels, a gear mechanism between the motor and a drive pulley, the drive pulley, a driven pulley, a timing belt, a guide rail that guides a lower part of the door, and a rubber packing provided around the door. According to this aspect, a deterioration state of each part of the motor can be estimated. Examples of the deteriorated state of each part include deterioration of a field magnet of the motor, deterioration of an armature coil, and reduction of lubricating oil in a rotating part.

The reference value may be set according to the information regarding the state of the motor acquired in the past (hereinafter, referred to as "past information"). For example, the reference value may be set by adding a predetermined value to the past information, or may be set by multiplying the past information by a predetermined value. The predetermined value to be multiplied by the past information may be a value of 1 or more. In this case, since the reference value can be set based on the motor itself, it is hard to be influenced by variation in installation environments that differ depending on installation sites. This reference value may be set after a maintenance operation such as the installation and maintenance of the automatic door (hereinafter, simply referred to as "maintenance"). A time after the installation and maintenance may be immediately after the installation and maintenance, or may be after an opening and closing operation is performed by a certain number of times (for example, 100 times) after the installation and maintenance.

For example, this reference value may be an average value, a median value, or a specific value of state information at the time of opening and closing when the door is opened and closed a certain number of times after the installation and maintenance. The specific value may be a value specified from information within a certain range in each state information. This reference value may be set not only after the installation and maintenance but also at a predetermined point in time or when a predetermined event occurs.

The reference value may be set according to information regarding the state of the motor acquired after an opening and closing operation is performed by a predetermined number of times. In this case, since the reference value can be set after hardness of a member made of a material having large temperature characteristics such as rubber and viscosity of grease applied to a moving part are stabilized, accurate determination can be performed. Examples of such a member include a rubber door roller, and examples of such grease include grease applied to a shaft and a bearing of the motor.

The specifier may specify the information regarding the maintenance by using a threshold value. This threshold value may be set according to a combination of at least two of a weight of the door, an area of a main surface of the door, an aspect ratio of the main surface of the door, an installation environment of the door, and a model of the automatic door. In this case, the influence of the error due to the installation environment of the automatic door can be reduced. For example, the specifier may determine whether or not a deviation between the reference value and the state information of the motor exceeds the threshold value. The main surface of the door means a surface having a largest area among surfaces of the door, and the model of the automatic door is set according to a difference of a circuit configuration other than the drive circuit of the motor instead of the controllable capacity of the motor.

The specifier may estimate a point in time at which the maintenance is to be performed based on an opening and closing frequency of the door. In this case, a maintenance point in time to be recommended and a replacement point in time of the member can be predicted. This opening and closing frequency may be a value obtained by evaluating the opening and closing frequency of the door itself of the automatic door to be specified for a certain period, or may be a value set as an estimation parameter for the automatic door to be specified. The value obtained by evaluating the opening and closing frequency and the set value may be stored in the storage as a frequency value. The specifier may estimate the point in time at which maintenance is to be performed by using the stored frequency value.

The point in time at which maintenance is to be performed may be a recommended maintenance point in time. The threshold value, the point in time at which maintenance is to be performed, and the opening and closing frequency can be set as parameters. Accordingly, the threshold value may be set based on the opening and closing frequency. For example, the point in time at which maintenance is to be performed may be set as a predetermined period (for example, half a year or one year), and the threshold value may be set according to the predetermined time and the frequency value.

For example, automatic doors of tourist facilities and leisure facilities have different opening and closing frequencies depending on the season, or between busy seasons and non-busy seasons. It is considered that the doors are used in the open or closed state depending on the season. Thus, the opening and closing frequency may be updated at a predetermined interval. In this case, it is possible to cope with seasonal fluctuations in the opening and closing frequency. For example, the frequency value may be updated by a value obtained by re-evaluating the opening and closing frequency of the automatic door to be specified or a newly set value. The predetermined interval may be determined by a period in which the opening and closing frequency of the automatic door changes, for example, one month, three months, or half a year.

The specifier may evaluate a fluctuation in the information regarding the state of the motor. In this case, the deteriorated part can be specified to some extent by evaluating this fluctuation. For example, it is possible to specify a fluctuation cycle by analyzing a pattern of state fluctuations. Frequency analysis using Fourier transform can be used for this analysis. For example, when a rotation cycle component of the door roller, a rotation cycle component of the pulley, a rotation cycle component of the motor, or an aperiodic component is confirmed in the state fluctuation, it is considered that a member related to this component deteriorates. The deteriorated part is specified in this manner, and thus, an efficient and accurate maintenance operation can be performed.

The acquirer may acquire the information regarding the state of the motor in the second speed control state in which the door is maintained at the second speed less than the first speed. In this case, the deteriorated part can be specified to some extent by analyzing the state information in the two speed control states. For example, the different speeds may be the first speed and the second speed. The acquirer may acquire the state information in the first speed control state in which the door is maintained at the first speed and the state information in the second speed control state in which the door is maintained at the second speed. For example, when the state information changes proportionally to the speed, it is possible to consider that a magnet or a coil of the motor deteriorates, and when the state information does not change proportionally to the speed, it is possible to consider that a mechanical system deteriorates.

The information regarding the state of the motor may be information regarding a current flowing through the motor. In this case, the state information can be easily detected without separately providing a sensor. The current flowing through the motor (hereinafter, referred to as a "motor current") can be detected by a current sensor provided in a path through which the current flows. There are no restrictions on a connection part of the current sensor on a circuit. For example, the current sensor may be a shunt resistor connected in series with the motor. The motor current may be acquired from a drive voltage applied to the motor. For example, the motor current may be calculated from a duty ratio of the drive voltage of the motor.

The acquirer may acquire the information regarding the state of the motor even in the deceleration control state in which the door is decelerated from the first speed. In this case, the deteriorated part can be specified to some extent by acquiring the state information in the deceleration control state. For example, when the mechanical system deteriorates and the load increases, the deceleration becomes large, and when the motor deteriorates, the deceleration becomes small. Thus, the deteriorated part can be specified based on a difference therebetween.

This system may include a presenter that presents a specification result of the specifier, and the presenter may be disposed near the door. In this case, an owner, a user, an administrator, and the like of the automatic door can be aware of a deterioration situation. For example, the presenter may be a notification device that emits light or sound, or may be a display device that outputs images or sounds. For example, the presenter may be provided on a transom, a frame, a pillar, a wall, or the like of an automatic door.

This system may include an output unit that outputs a specification result of the specifier. In this case, the deterioration situation can be notified to a remote place. For example, the output unit may output the specification result to an external device by communication means such as wired or wireless means, or may transmit an e-mail. This communication means may include a network such as the Internet. This communication means may output the specification result by short-range wireless communication. The external device may be a computer, a server, a cloud, or the like provided separately from the automatic door, or may be a portable terminal or a smartphone carried by the service technician.

This system may include a transmitter that transmits an acquisition result of the acquirer to a cloud server, the acquirer may be provided at or near the automatic door, and the specifier may be provided in the cloud server. In this case, the threshold value can be easily updated by providing the specifier in the cloud server. The state information can be analyzed by an advanced method such as Fourier analysis. The specification result is stored in the cloud server, and thus, the service technician can efficiently perform the maintenance operation while referring to the specification result on the server. For example, the transmitter may transmit the acquisition result (state information) of the acquirer to the cloud server via the communication means and the network. The cloud server is not particularly limited as long as the cloud server is a server provided on a cloud environment.

Still another aspect of the present invention is an automatic door apparatus. This apparatus includes an opening and closing mechanism including a door, a drive mechanism that drives a motor to open and close the door, a control unit that controls the motor, an acquirer that acquires state information of the motor in a speed control state in which the door is maintained at a predetermined speed by the control unit, and a specifier that specifies information regarding maintenance of an automatic door by comparing the acquired state information with a predetermined reference value. In the case of a sliding door, the opening and closing mechanism may include a door, a door roller supporting the door, and a rail on which the door roller travels. This drive mechanism may include a motor, a drive pulley driven by the motor, a driven pulley provided as a pair with the drive pulley, a belt spanned by the drive pulley and the driven pulley, and a connection part that connects the belt and the door. According to this aspect, since the acquisition and specification are performed within the range of the automatic door, the connection between the acquirer and the specifier becomes easier, and the configuration can be simplified compared to a case where the specifier is separately provided outside. That is, it is not necessary to separately provide the maintenance support system.

Still another aspect of the present invention is an automatic door maintenance support method. This method includes a step of acquiring state information of a motor which drives a door of an automatic door in a speed control state in which the door is maintained at a predetermined speed, and a step of specifying information regarding maintenance of the automatic door by comparing the acquired state information with a predetermined reference value. According to this aspect, since the state information is used, accuracy of state diagnosis and prediction of necessity for maintenance of the automatic door and the components thereof can be improved compared to a case where a failure is simply diagnosed from the number of times of opening and closing and the like.

Still another aspect of the present invention is a program causing a computer to execute an automatic door maintenance support method. This program includes a step of acquiring state information of a motor which drives a door of an automatic door in a speed control state in which the door is maintained at a predetermined speed, and a step of specifying information regarding maintenance of the automatic door by comparing the acquired state information with a predetermined reference value. According to this aspect, since the state information is used, accuracy of state diagnosis and prediction of necessity for maintenance of the automatic door and the components thereof can be improved compared to a case where a failure is simply diagnosed from the number of times of opening and closing and the like.

Hereinafter, preferred embodiments of the present invention will be described with reference to the drawings. In the embodiments and modification example, the same or equivalent components and members are designated by the same reference signs, and the redundant description will be appropriately omitted. Dimensions of the members in the drawings are appropriately enlarged or reduced for easy understanding. In the drawings, some of the members that are not important for describing the embodiments are omitted.

Although terms including ordinal numbers such as first and second are used to describe various components, these terms are used only to distinguish one component from another component, and the components are not limited by the terms.

First Embodiment

Figure 2:
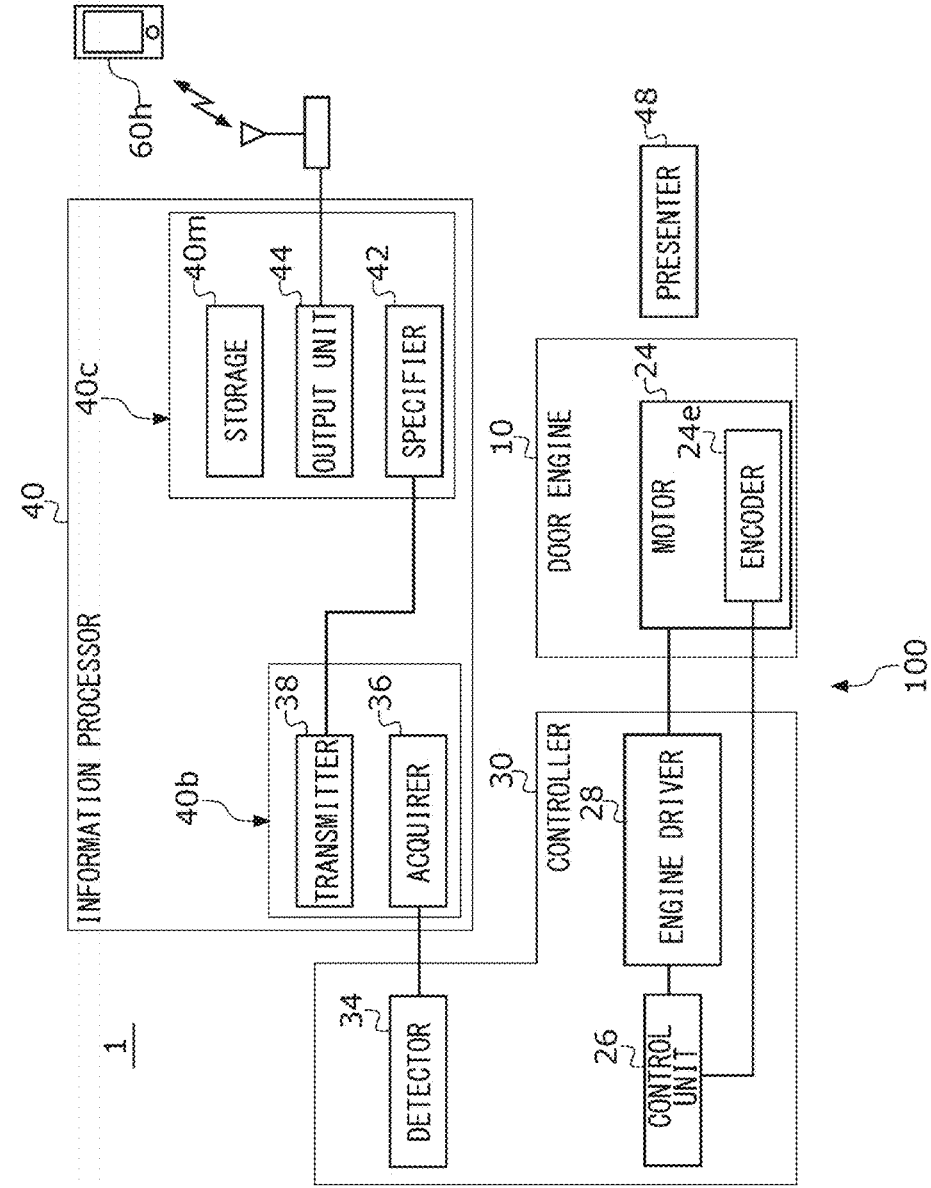
FIG. 2 is a block diagram schematically illustrating the automatic door maintenance support system of FIG. 1.

A configuration of an automatic door maintenance support system 1 according to a first embodiment of the present invention will be described with reference to FIGS. 1 and 2. FIG. 1 is a front view schematically illustrating an automatic door 100 to which the automatic door maintenance support system 1 according to the first embodiment is applied. FIG. 2 is a block diagram schematically illustrating the automatic door maintenance support system 1.

Although functional blocks illustrated in FIG. 2 can be realized by electronic elements such as a CPU of a computer and mechanical parts in terms of hardware and are realized by a computer program in terms of software, the functional blocks realized by cooperation between the hardware and the software are illustrated. Accordingly, those skilled in the art will understand that these functional blocks can be realized in various forms by combining the hardware and the software. The same applies to functional blocks of FIGS. 6 and 7 to be described later.

As illustrated in FIGS. 1 and 2, the automatic door maintenance support system 1 includes the automatic door 100 and an information processor 40. The automatic door 100 is driven by a motor 24 to open and close doors 12. The information processor 40 processes information regarding a state of the motor 24 (hereinafter, referred to as "state information Li"). The automatic door 100 will be described first, and the information processor 40 will be described later.

Automatic Door

The automatic door 100 mainly includes a door engine 10, a door 12, a belt 14, a drive pulley 16, a driven pulley 18, a traveling rail 20, a suspension 22, a controller 30, a door sensor 32, a presenter 48, a guide rail 82, and rubber packings 84. A movable direction of the doors 12 of the present embodiment is parallel to a horizontal X-axis direction. An expected direction of the doors 12 is parallel to a horizontal Y-axis direction orthogonal to the X-axis direction. A vertical direction of the doors 12 is parallel to a Z-axis direction orthogonal to the X-axis direction and the Y-axis direction. The notation of such a direction does not limit a posture in which the automatic door 100 is used, and the automatic door 100 can be used in any posture depending on an intended use. The presenter 48 will be described later.

The door engine 10 includes the motor 24 and a gear mechanism (not illustrated) that drives rotation of the drive pulley 16 based on the rotation of the motor 24. The door engine 10 functions as a power source for opening and closing the doors 12 by a driving force of the motor 24. The motor 24 is driven by an intelligent power module (IPM) provided in an engine driver 28 to be described later. The motor 24 may be a motor based on various known principles. The motor 24 of the present embodiment is a brushless motor having an encoder 24e using a Hall IC.

The driven pulley 18 is provided at a distance from the drive pulley 16 in the X-axis direction. The belt 14 is wound around an outer periphery of the drive pulley 16 and the driven pulley 18 in a loop shape. The belt 14 rotates the driven pulley 18 as the drive pulley 16 rotates. The belt 14 may be a toothed timing belt.

The traveling rail 20 is a rail member for guiding the doors 12 above the doors 12, and extends in the movable direction (X-axis direction) of the doors 12. The suspension 22 is a mechanism for suspending the doors 12 at the traveling rail 20, and is provided at an upper portion of the doors 12. The suspension 22 has door rollers 22c that roll at the traveling rail 20, and is supported by the traveling rail 20 via the door rollers 22c. The doors 12 are connected to the belt 14 via a connection member 12j.

The door sensor 32 is attached to a transom 80 or the like to detect a passerby or the like. The controller 30 opens and closes the doors 12 by controlling the motor 24 of the door engine 10 according to the detection result of the passerby or the like from the door sensor 32. The controller 30 includes the engine driver 28 that drives the motor 24 of the door engine 10, a control unit 26 that controls an operation of the automatic door 100, and a detector 34 that detects the state information Li of the motor 24. The detector 34 will be described later.

The guide rail 82 is a rail having a groove extending in the X-axis direction in order to guide steady rests 12s extending from lower portions of the doors 12. When the doors 12 move, the steady rests 12s of the doors 12 rub against the guide rail 82. The rubber packings 84 are provided around the doors 12 or the like in order to mainly improve airtightness. When the doors 12 move, the rubber packings 84 rub against either a movable part or a fixed part.

In the automatic door 100 having the aforementioned configuration, when the motor 24 drives rotation of the drive pulley 16, the drive pulley 16 and the driven pulley 18 rotate, and the belt 14 moves in the loop shape. When the belt 14 moves, the suspension 22 suspended at the belt 14 via the connection member 12j moves on the traveling rail 20 in the X-axis direction. The doors 12 are opened and closed by moving in the X-axis direction together with the suspension 22. By operating in this manner, a moving speed of the doors 12 (hereinafter, referred to as a "door speed Vd") is proportional to a rotational speed of the motor 24. The automatic door 100 opens the doors 12 when the door sensor 32 detects the passerby or the like, and closes the doors 12 at a predetermined timing when the door sensor 32 stops detecting the passerby or the like.

Opening Operation

Figure 3:
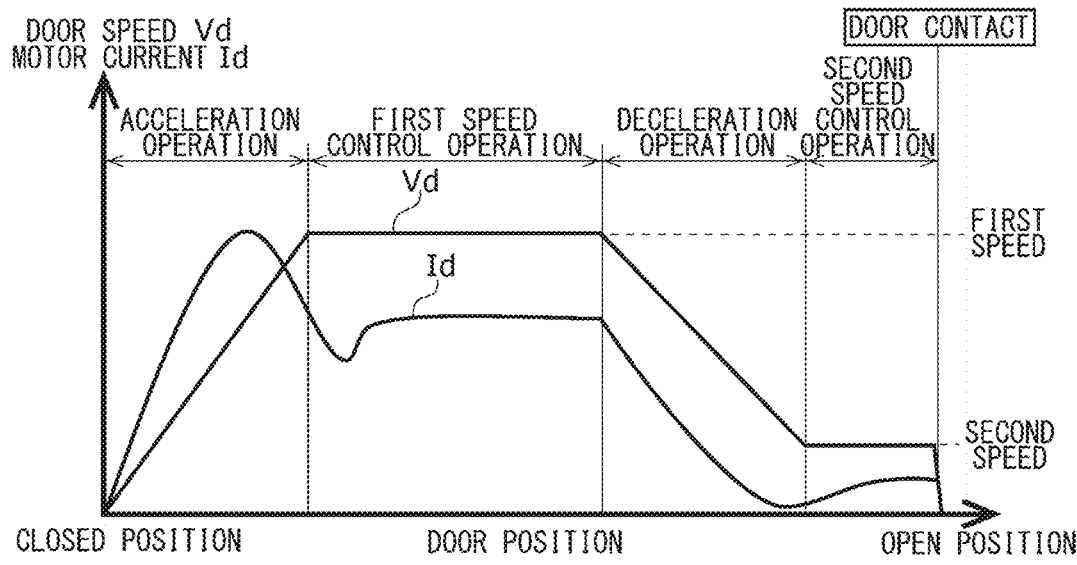
FIG. 3 is a diagram illustrating an example of transition of a door speed in an opening operation of an automatic door of FIG. 1.

An opening operation of the doors 12 will be described with reference to FIG. 3. FIG. 3 is a diagram illustrating an example of transition of the door speed Vd of the doors 12 in the opening operation. In this figure, a horizontal axis indicates a position from a closed position to an open position of the doors 12 (hereinafter, referred to as a "door position"), and a vertical axis indicates the door speed Vd of the doors 12 and a current for driving the motor 24 (hereinafter, referred to as a "motor current Id"). The opening operation is an operation of stopping the doors 12 by moving the doors stopped at the closed position to the open position. The opening operation of the present embodiment includes an acceleration operation of accelerating the doors 12 stopped at the closed position to a predetermined first speed, a first speed control operation of maintaining the first speed, a deceleration operation of decelerating the doors to a second speed, a second speed control operation of maintaining the second speed, and a door contact operation of stopping the doors 12 by coming in contact with a stopper (not illustrated). The acceleration operation, the first speed control operation, the deceleration operation, the second speed control operation, and the door contact operation are collectively referred to as "each operation".

As illustrated in FIG. 3, the first speed is greater than the second speed, and the second speed is less than the first speed. In the first speed control operation, the speed Vd of the doors 12 of the automatic door 100 is maintained constant at the first speed. This state is referred to as a first speed control state. In the second speed control operation, the speed Vd of the doors 12 of the automatic door 100 is maintained constant at the second speed. This state is referred to as a second speed control state. When the first speed control state and the second speed control state are collectively referred to as "each control state".

In the acceleration operation, when the speed Vd reaches the first speed, the operation is switched to the first speed control operation. In the first speed control operation, when the door position reaches a predetermined position, the operation is switched to the deceleration operation. In the deceleration operation, when the speed reaches the second speed, the operation is switched to the second speed control operation. In the second speed control operation, the doors 12 are moved to the open position. When the doors 12 reach the open position, the doors 12 are stopped by coming in contact with the stopper due to the door contact operation.

This operation will be described in more detail. In the acceleration operation, a supply voltage to the motor 24 (hereinafter, simply referred to as a "motor voltage") is controlled such that a relationship between the door speed Vd and the door position follows a predetermined acceleration curve. Pulse width modulation (PWM modulation) is performed on the motor voltage, and the motor voltage is controlled by a duty ratio thereof. In the acceleration operation, the motor 24 may be controlled at a constant voltage, a constant current, or a constant acceleration. In this operation, the motor current Id increases as the door speed Vd increases as illustrated in FIG. 3.

In the first speed control operation, when the speed Vd fluctuates from the first speed, the motor voltage is controlled so as to suppress the fluctuation. At this time, the motor 24 may be controlled at a constant speed. This control may be a control that feeds back a detected motor speed, or may be a control that does not include feedback. The first speed may be a maximum moving speed of the doors 12 or a speed close to the maximum moving speed. In this operation, the motor current Id is substantially constant although there is some fluctuations as illustrated in FIG. 3.

In the deceleration operation, the motor voltage is controlled such that the relationship between the door speed Vd and the door position follows a predetermined deceleration curve. In this operation, the motor voltage is gradually reduced, and the doors are decelerated due to a sliding load of the doors 12 or the like. In the deceleration operation, a brake torque may be produced by a short brake operation that short-circuits a counter-electromotive force of the motor 24, or a brake torque may be produced by supplying a voltage having a polarity opposite to that at the time of acceleration to the motor 24. In the deceleration operation, the motor 24 may be controlled at a constant voltage, a constant current, or a constant acceleration. In this operation, the motor current Id decreases as the door speed Vd decreases as illustrated in FIG. 3.

In the second speed control operation, when the speed Vd fluctuates from the second speed, the motor voltage is controlled so as to suppress the fluctuation. At this time, the motor 24 may be controlled at a constant speed. In the present embodiment, the doors 12 moving at the second speed are stopped by bringing the door 12 into contact with the stopper. In order to reduce an impact when the doors 12 come in contact with the stopper, the second speed may be a speed less than the first speed, for example, a slow speed that stops in a short time. In this operation, the motor current Id is substantially constant although there is some fluctuations as illustrated in FIG. 3.

In the door contact operation, the doors 12 are stopped by coming into contact with the stopper at the open position. The reaction of the contact may cause a slight change in the position of the doors 12. When the doors 12 are stopped at the open position, power enough to maintain the doors 12 at the open position may be supplied to the motor 24, or the power supply to the motor 24 may be stopped. This power supply may be temporary or continuous.

Closing Operation

The closing operation is an operation of stopping the doors 12 by moving the doors 12 from the open position to the closed position. The closing operation is different from the opening operation in that the moving direction of the doors 12 is opposite, and includes the acceleration operation, the first speed control operation, the deceleration operation, the second speed control operation, and the door contact operation similar to the opening operation. Each operation is similar to the opening operation, and redundant description is omitted.

Information Processor

Next, the information processor 40 will be described with reference to FIG. 2. The information processor 40 processes the state information Li of the motor 24 in order to support the maintenance of the automatic door 100. A part or all of the components of the information processor 40 may be provided integrally with the controller 30, may be provided separately from the controller 30, or may be provided at a distance from the automatic door 100. In the present embodiment, an acquirer 36 and a transmitter 38 are provided in a first block 40b integrally with the controller 30, and a specifier 42, an output unit 44, and a storage 40m are provided in a second block 40c separately from the controller 30. As an example, the second block 40*c* is provided in a computer of a management center that manages one or a plurality of automatic doors.

Acquirer

The acquirer 36 acquires the state information Li of the motor 24 detected by the detector 34. In particular, the acquirer 36 acquires the state information Li of the motor 24 that drives the doors 12 in the first speed control state and the second speed control state. The state information Li is not particularly limited, but the state information Li of the present embodiment is the motor current Id. The acquirer 36 of the present embodiment acquires the state information Li from the detection result of the detector 34. The detector 34 can detect the motor current Id as a voltage drop of a shunt resistor (not illustrated) connected in series with the motor 24.

The acquirer 36 can acquire the door speed Vd according to a cycle and a frequency of an output signal of the encoder 24*e* of the motor 24. The acquirer 36 can acquire the door position of the doors 12 by counting the output signal of the encoder 24*e*.

Transmitter

The transmitter 38 of the present embodiment transmits the acquisition result of the acquirer 36 to the specifier 42 via a network or a data bus. In this example, the acquisition result of the acquirer 36 is also the state information Li.

Specifier

The specifier 42 compares the state information Li acquired by the acquirer 36 with a predetermined reference value Ls, and specifies information regarding the maintenance of the automatic door 100. In particular, the specifier 42 compares the state information Li with the reference value Ls, and specifies the information regarding the maintenance of the automatic door 100. The reference value Ls of the present embodiment is a reference value set at the time of installation or maintenance of the automatic door 100. As an example, the specifier 42 determines that maintenance is necessary when a deviation of the state information Li from the reference value Ls is large, and determines that maintenance is unnecessary when this deviation is small. The specifier 42 may determine that maintenance is necessary within a certain period when this deviation is about medium.

Output Unit

The output unit 44 outputs a specification result Sj of the specifier 42 to the outside. In this example, the output unit 44 outputs the specification result Sj of the specifier 42 to the presenter 48. The presenter 48 presents the specification result Sj. The presenter 48 of the present embodiment is disposed in a frame near the doors 12 and has an LED 48*b*. The presenter 48 presents the specification result according to a turned-on or -off state of the LED 48*b*. In this example, the LED 48*b* is turned on in green when the maintenance is unnecessary, the LED 48*b* is turned on in yellow when the maintenance is necessary within a certain period, and the LED 48*b* is turned on in red when the maintenance is necessary early.

In this example, the output unit 44 outputs the specification result Sj to an information terminal 60*h* via communication means. The output unit 44 may transmit the specification result Sj to the information terminal 60*h* by using an e-mail. The information terminal 60*h* may be a desktop computer or a terminal carried by a service technician. The specification result Sj is displayed on the information terminal 60*h* carried by the service technician, and thus, it is possible to easily grasp the abnormality and the necessity for maintenance of the automatic door 100. In this case, it is possible to easily explain the abnormality and the necessity of maintenance of the automatic door to an owner of the automatic door and the like.

The storage 40*m* stores the reference value Ls, the state information Li, the specification result Sj, a threshold value Lt, and an opening and closing frequency F which will be described later.

Reference Value

The reference value Ls will be described. For example, the reference value Ls may be set to a value calculated in design. For example, the reference value Ls may be set to an average value of pieces of state information of motors of a plurality of other automatic doors of the same type. In the present embodiment, the reference value Ls is set according to the state information Li of the motor 24 itself acquired in the past. In particular, the reference value Ls is set in the state information of the motor 24 itself acquired at the time of installation or maintenance of the automatic door 100. The state information used for the reference value Ls may be acquired immediately after the installation and maintenance of the automatic door 100, but in this example, may be acquired after the opening and closing operation is performed a number of times (for example, 100 times) predetermined from the installation and maintenance of the automatic door 100. The reference value Ls may be set by the state information at the time of one opening and closing operation, but in this example, the reference value Ls is an average value of a plurality of pieces of state information when the opening and closing operation is performed multiple number of times.

When the reference value is set once, the reference value Ls may be constant until the next maintenance. However, the state of the motor has temperature characteristics, and may increase when a temperature is low and decrease when the temperature is high. Thus, the reference value Ls may be updated for each predetermined season. The set or updated reference value Ls is stored in the storage 40*m*.

It is desirable that a threshold value is used to quantitatively determine the magnitude of the deviation of the state information Li from the reference value Ls. Thus, the specifier 42 of the present embodiment classifies the deviation of the state information Li from the reference value Ls by one or a plurality of threshold values Lt, and sets the classification result as the specification result Sj. In particular, the specifier 42 is configured to perform a notification prompting maintenance (hereinafter, referred to as "maintenance notification") when the deviation of the state information Li from the reference value Ls exceeds the threshold value Lt.

The threshold value Lt may be set to a value calculated in design. However, wear and deterioration rates of the components of the automatic door vary depending on a weight of the door, the magnitude of a wind pressure received by the door, and the like. Thus, in the present embodiment, the threshold value Lt can be set according to a combination of at least two of the weight of the door 12, an area of a main surface of the door 12, an aspect ratio of the main surface of the door 12, an installation environment of the door 12 (salt-damaged area and the like), and a model of the automatic door 100. The threshold value Lt is set based on factors selected from the aforementioned factors according to a situation at an installation site of the automatic door 100.

The threshold value Lt may be constant when the threshold value is set once, but the wear and deterioration rates may change due to various factors. Thus, the threshold value Lt may be updated according to a change situation of the factor. The set or updated threshold value Lt is stored in the storage 40m.

Figure 4:
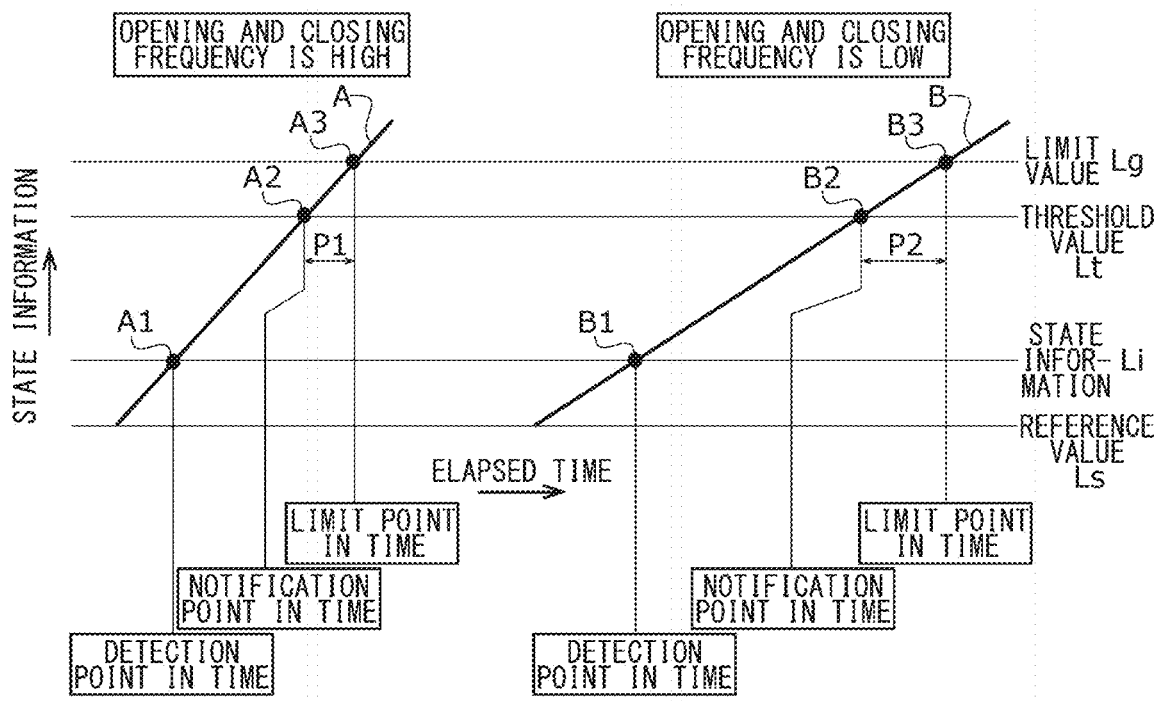
FIG. 4 is an explanatory diagram for describing a method of estimating a maintenance point in time of the automatic door of FIG. 1.
Figure 5:
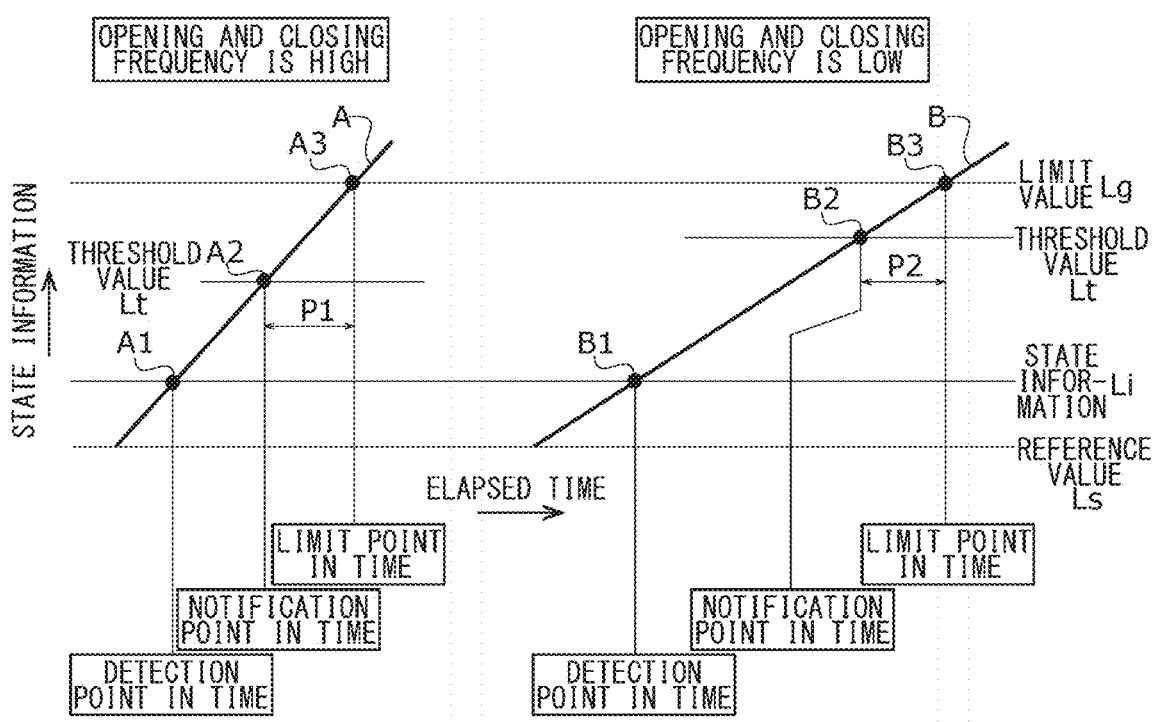
FIG. 5 is another explanatory diagram for describing a method of estimating the maintenance point in time of the automatic door of FIG. 1.

A method of estimating the point in time at which maintenance is to be performed will be described. FIGS. 4 and 5 are explanatory diagrams for describing the method of estimating the point in time at which maintenance is to be performed. A horizontal axis indicates an elapsed time, and a vertical axis indicates the state information. Lines indicated by reference signs A and B are prediction lines for changes in the state information with respect to the elapsed time. A1 and B1 are timings when the state information Li is detected, and hereinafter, are referred to as "detection points in time". A2 and B2 are timings when the prediction lines A and B exceed the threshold value Lt, and are times for performing the maintenance notification (hereinafter, referred to as "notification points in time"). A3 and B3 are timings when the prediction lines A and B reach a limit value Lg, and hereinafter, are referred to as "limit points in time". The limit value Lg is a value at which it is expected that a failure may occur when the prediction lines reach this value.

P1 and P2 indicate periods from the notification points in time to the limit points in time (hereinafter, referred to as "remaining periods P"). FIG. 4 illustrates a case where the threshold values Lt are the same at the prediction lines A and B, and the remaining period P1 is shorter than the remaining period P2. FIG. 5 illustrates a case where the threshold values Lt are different at the prediction lines A and B, and the remaining period P1 is equal to the remaining period P2.

The slopes of the prediction lines A and B differ depending on the rate of wear and deterioration of the components of the automatic door (hereinafter referred to as "deterioration rate D"). A deterioration rate D is considered to be roughly proportional to the opening and closing frequency F of the door 12, and can be substituted with a product of a proportionality constant k and the opening and closing frequency F. That is, since the prediction line A has a higher opening and closing frequency F and a higher deterioration rate D than those of the prediction line B, the remaining period becomes short. From these reasons, the remaining period P can be obtained from the limit value Lg, the threshold value Lt, and the deterioration rate D as represented in Equation 1.

$$\text{Remaining period } P = (\text{limit value } Lg - \text{threshold value } Lt) / \text{deterioration rate } D \qquad \text{(Equation 1)}$$

Equation 2 is derived by replacing the deterioration rate D with the product of the proportionality constant k and the opening and closing frequency F.

$$\text{Remaining period } P = (\text{limit value } Lg - \text{threshold value } Lt) / (k \cdot \text{opening and closing frequency } F) \qquad \text{(Equation 2)}$$

From Equation 2, the remaining period P can be set according to the opening and closing frequency F.

When the maintenance notification is performed at a timing when the remaining period P is short as in the prediction line A, the maintenance may not be in time. Thus, it is desirable that the maintenance notification be given at a timing when the remaining period P has a margin. Accordingly, in the present embodiment, the threshold value Lt is set based on the opening and closing frequency F such that the maintenance notification is performed when the remaining period P reaches a certain period. This certain period may be, for example, three months, six months, 12 months, and the like.

FIG. 5 illustrates a case where the threshold value Lt is changed according to the opening and closing frequency F.

In this example, the prediction line A having a high opening and closing frequency F has a smaller threshold value Lt than that of the prediction line B having a low opening and closing frequency F. As a result, the remaining period P1 is substantially equal to the remaining period P2. The threshold value Lt for maintaining the remaining period P constant can be obtained from the limit value Lg, the remaining period P, and the deterioration rate D as represented in Equation 3.

$$\text{threshold value } Lt = \text{limit value } Lg - \text{remaining period } P \cdot \text{deterioration rate } D \qquad \text{(Equation 3)}$$

Equation 4 is derived by replacing the deterioration rate D with the product of the proportionality constant k and the opening and closing frequency F.

$$\text{threshold value } Lt = \text{limit value } Lg - \text{remaining period } P \cdot (k \cdot \text{opening and closing frequency } F) \qquad \text{(Equation 4)}$$

From Equation 4, the threshold value Lt can be set according to the opening and closing frequency F.

The opening and closing frequency F substituted into the above Equations 2 and 4 is initially set as one of parameters. The opening and closing frequency F may be constant with the initial setting. However, the opening and closing frequency F may differ greatly depending on a season or between a busy season and a non-busy season. Thus, opening and closing frequency F of the present embodiment is updated at a predetermined interval. The update interval of the opening and closing frequency F is set according to a period in which the opening and closing frequency of the automatic door changes such as one month, three months, and six months. The set or updated opening and closing frequency F is stored in the storage 40m.

The state information may behave characteristically depending on a deteriorated part of the component of the automatic door. Thus, the specifier 42 of the present embodiment also evaluates the fluctuation in the state information Li of the motor 24. In this example, a rotation cycle component of the door roller 22c, rotation cycle components of the drive pulleys 16 and 18, a rotation cycle component of the motor 24, and the like are extracted by frequency analysis of the fluctuation in the state information Li. When these rotation cycle components are significantly detected, it is possible to specify that the member related to the rotation cycle deteriorates. This frequency analysis can be realized by performing Fourier transform on the state information Li stored in the storage 40m in time series. When an aperiodic component is significantly detected, the traveling rail 20, the belt 14, the steady rests 12s, the guide rail 82, the rubber packings 84, and the like are considered to deteriorate.

The state information may behave characteristically at a low speed depending on the deteriorated part of the component of the automatic door. Thus, the acquirer 36 of the present embodiment acquires the state information Li of the motor 24 even in the second speed control state in which the door 12 is maintained at the second speed less than the first speed. When the state information Li at the first and second speeds changes proportionally to the speed Vd of the doors 12, it is possible to specify that a magnet (not illustrated) or a coil (not illustrated) of the motor 24 deteriorates, and when the state information at the first and second speeds does no change proportionally to the speed of the door, it is possible to specify that a mechanical system deteriorates.

The state information may behave characteristically during the deceleration control depending on the deteriorated part of the component of the automatic door. Thus, the acquirer 36 of the present embodiment acquires the state information Li of the motor 24 even in the deceleration control state in which the door is decelerated from the first speed. When the deceleration is large, it is possible to specify that the mechanical system deteriorates, and when the deceleration is small, it is possible to specify that the magnet or the coil of the motor 24 deteriorates.

In the automatic door maintenance support system 1 having the aforementioned configuration, the opening operation or the closing operation is performed at a predetermined timing on a daily basis, the state information Li of the motor 24 is acquired, and the information regarding the maintenance of the automatic door 100 is specified by comparing the acquired state information Li with the reference value Ls. This operation may be executed as a fixed operation at the start or end of the automatic door 100, for example. The specification result Sj is presented to the presenter 48 and the information terminal 60*h*. A service technician, an administrator, or the like may create a maintenance plan by confirming whether or not the maintenance is necessary according to the presented specification result Sj.

The state information Li and the specification result Sj may be stored in time series. Characteristics such as the deterioration rate of the automatic door 100 can be specified from the state information Li stored in time series.

The above description is the description of the first embodiment.

Second Embodiment

Figure 6:
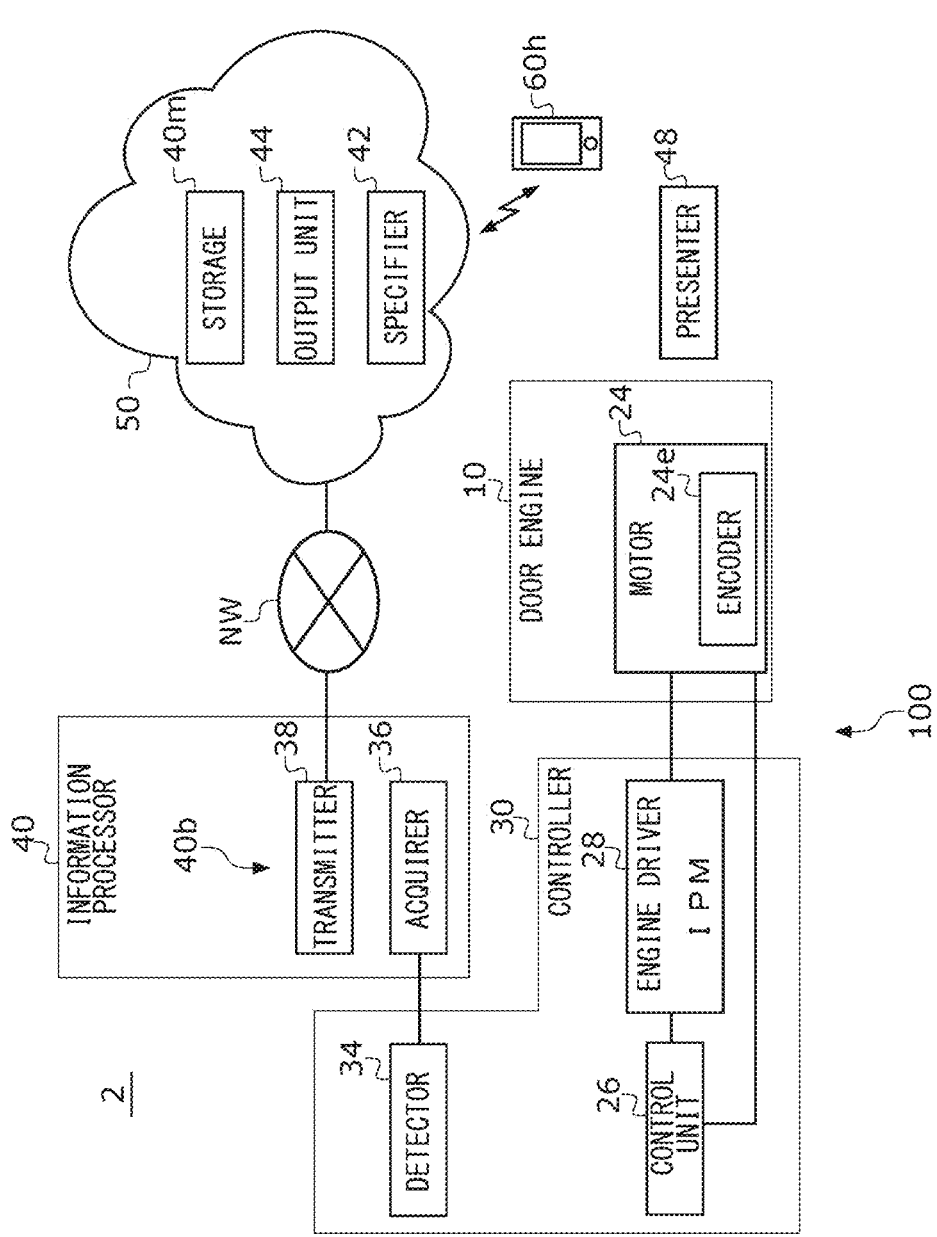
FIG. 6 is a block diagram schematically illustrating an automatic door maintenance support system according to a second embodiment.

A configuration of an automatic door maintenance support system 2 according to a second embodiment of the present invention will be described with reference to FIG. 6. FIG. 6 is a block diagram schematically illustrating the automatic door maintenance support system 2, and corresponds to FIG. 2. In the drawing and description of the second embodiment, the same or equivalent components and members as those of the first embodiment are designated by the same reference signs. The descriptions overlapping with those of the first embodiment will be appropriately omitted, and configurations different from those of the first embodiment will be mainly described.

In the second embodiment, the acquirer 36 and the transmitter 38 are provided at or near the automatic door 100, and the specifier 42, the output unit 44, and the storage 40*m* are provided in a cloud server 50. The transmitter 38 of the present embodiment transmits the acquisition result (state information Li) of the acquirer 36 to the cloud server 50 via a network NW. The output unit 44 of the present embodiment outputs the specification result Sj of the specifier 42 to the information terminal 60*h* via the network NW. The second embodiment is different from the first embodiment in these points, and the other configurations are the same.

The second embodiment having the aforementioned configuration operates in the same manner as in the first embodiment, and has the same effects as those in the first embodiment.

Third Embodiment

Figure 7:
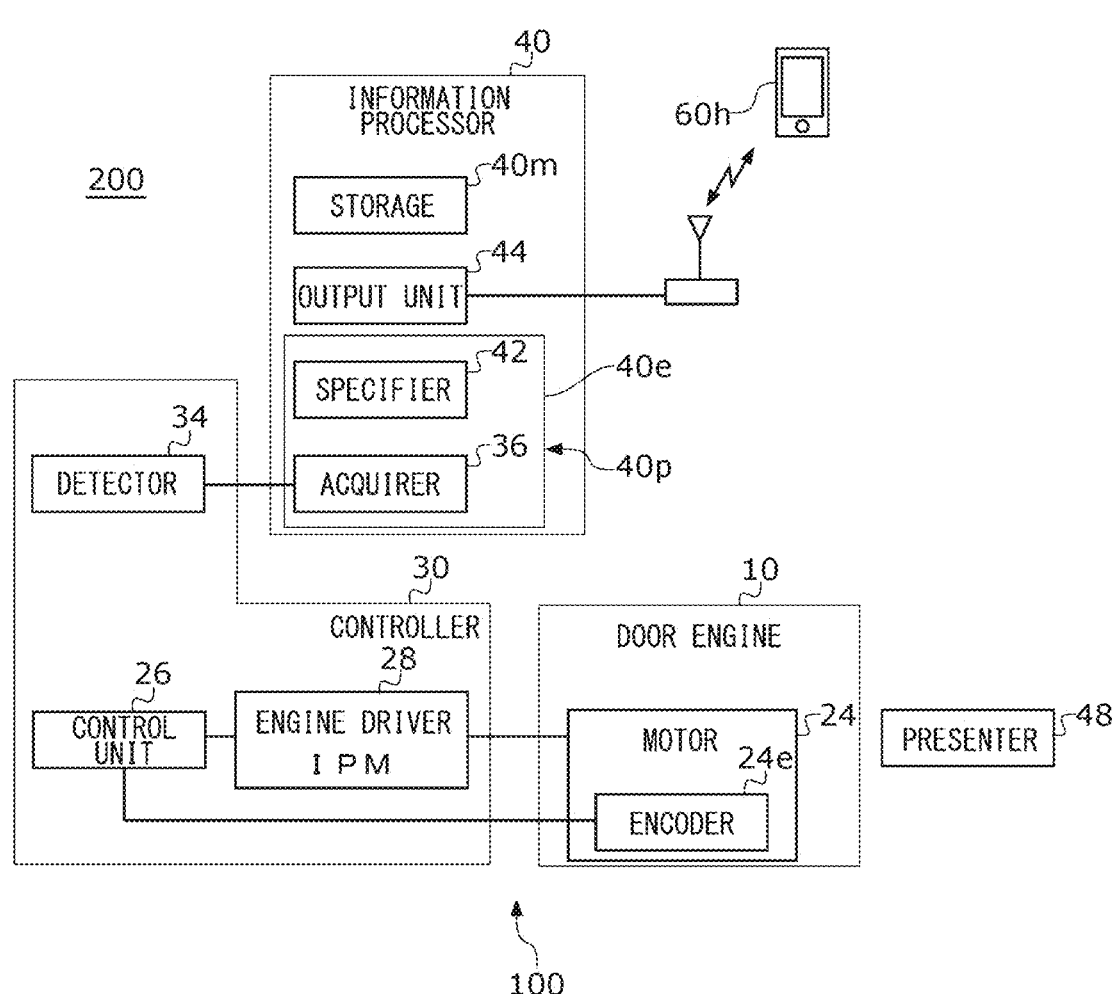
FIG. 7 is a block diagram schematically illustrating an automatic door apparatus according to a third embodiment.

A configuration of an automatic door apparatus 200 according to a third embodiment of the present invention will be described with reference to FIG. 7. FIG. 7 is a block diagram schematically illustrating the automatic door apparatus 200, and corresponds to FIG. 2. In the drawings and description of the third embodiment, the same or equivalent components and members as those of the first embodiment are designated by the same reference signs. The descriptions overlapping with those of the first embodiment will be appropriately omitted, and configurations different from those of the first embodiment will be mainly described.

In the third embodiment, the acquirer 36, the specifier 42, the output unit 44, and the storage 40*m* are provided at or near the automatic door 100. These components may be provided integrally with the controller 30. In particular, functions of the acquirer 36 and the specifier 42 are realized by a computer 40*e* in terms of hardware and are realized by a program 40*p* of the computer 40*e* in terms of software.

Figure 8:
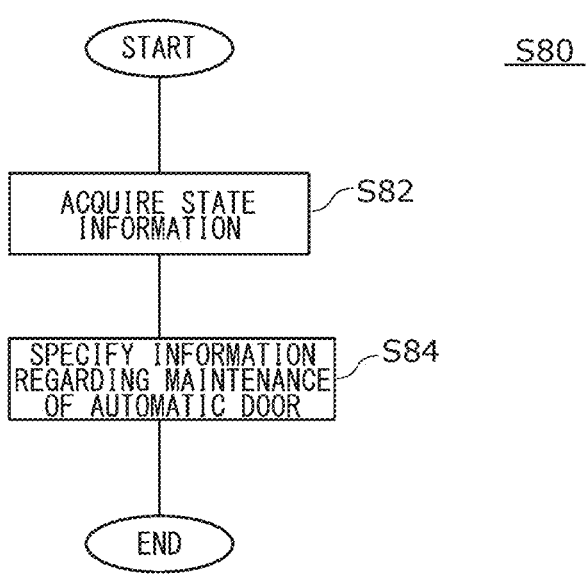
FIG. 8 is a flowchart illustrating processing of a computer program of the automatic door apparatus of FIG. 7.

FIG. 8 is a flowchart illustrating processing S80 of the program 40*p*. The processing S80 of the program 40*p* includes step S82 of acquiring, by the doors 12 of the automatic door 100, the state information Li of the motor 24 that drives the door 12 in the first speed control state, and step S84 of specifying the information regarding the maintenance of the automatic door 100 by comparing the acquired state information Li with the reference value Ls. Operations of steps S82 and S84 are the same as the operations of the acquirer 36 and the specifier 42 described above, and redundant description is omitted.

Fourth Embodiment

Figure 9:
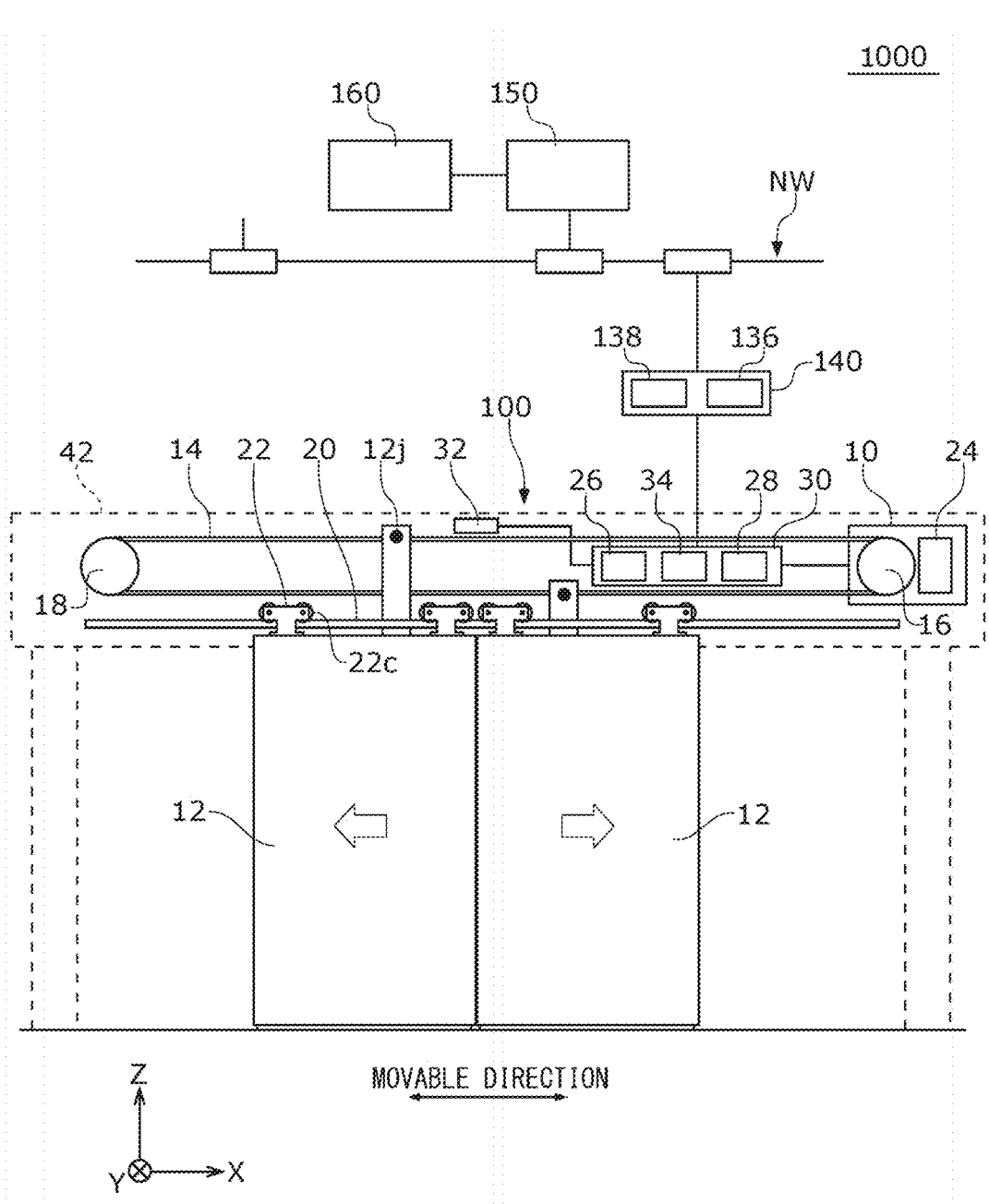
FIG. 9 is a front view schematically illustrating an automatic door to which an automatic door maintenance support system according to a fourth embodiment is applied.
Figure 10:
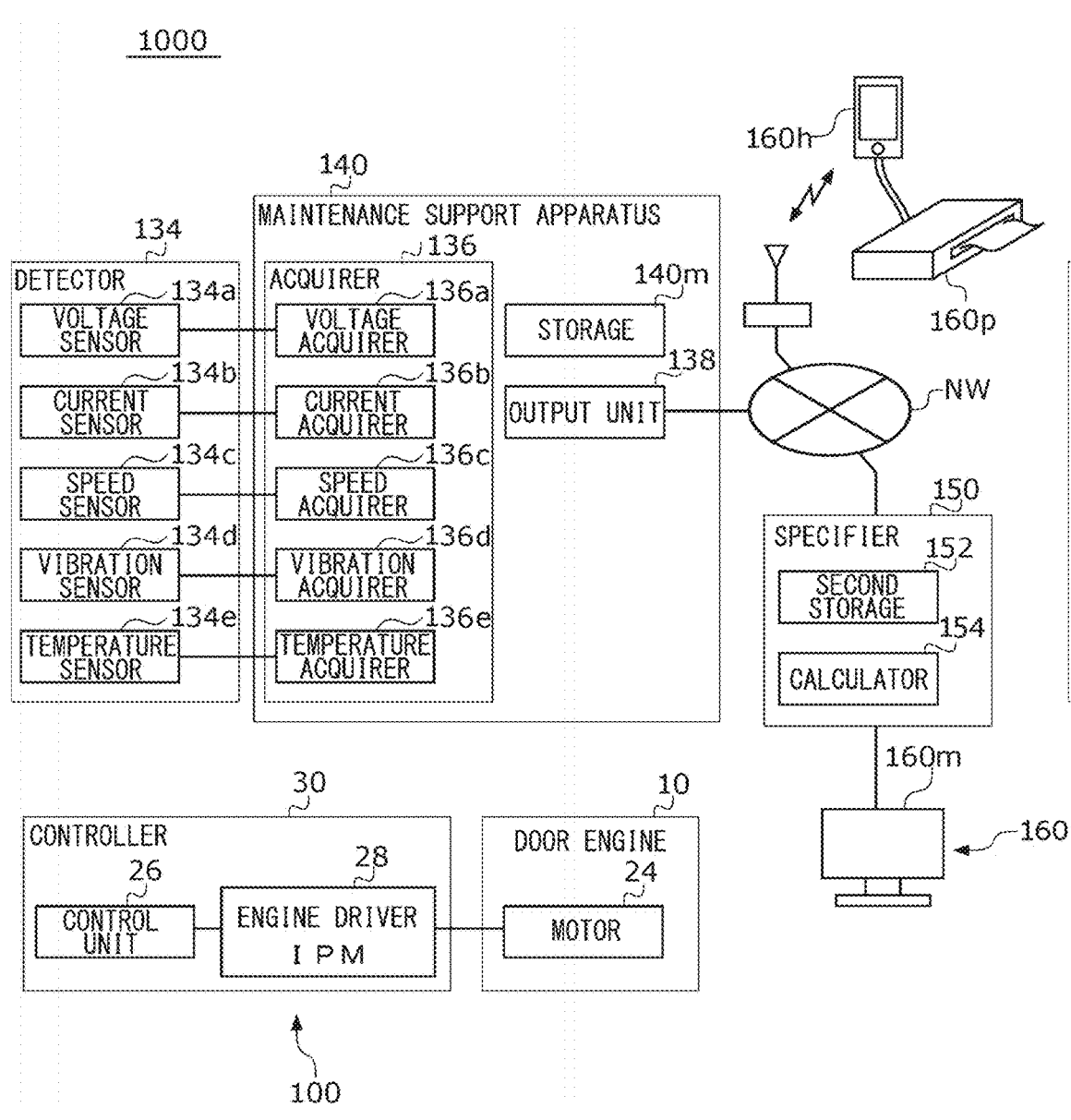
FIG. 10 is a block diagram schematically illustrating the automatic door maintenance support system of FIG. 9.

A configuration of an automatic door maintenance support system 1000 according to a fourth embodiment of the present invention will be described with reference to FIGS. 9 and 10. FIG. 9 is a front view schematically illustrating the automatic door 100 to which the automatic door maintenance support system 1000 according to the fourth embodiment is applied. FIG. 10 is a block diagram schematically illustrating the automatic door maintenance support system 1000.

As illustrated in FIGS. 9 and 10, the automatic door maintenance support system 1000 includes a maintenance support apparatus 140, a specifier 150, and a presenter 160 instead of the information processor 40 of the automatic door maintenance support system 1 of FIGS. 1 and 2. The automatic door 100 is driven by the motor 24 to open and close the doors 12. Except for the information processor 40, the other configurations of the automatic door maintenance support system 1000 are the same as the configurations of the automatic door maintenance support system 1.

Maintenance Support Apparatus

The maintenance support apparatus 140 will be described. The maintenance support apparatus 140 acquires the state information of the motor 24 in order to support the maintenance of the automatic door 100. The maintenance support apparatus 140 may be provided integrally with the controller 30, may be provided separately from the controller 30, or may be provided at a distance from the automatic door 100. The maintenance support apparatus 140 of the present embodiment includes an acquirer 136 that acquires state information Mi of the motor 24, an output unit 138 that outputs the acquired state information Mi of the motor 24, and a storage 140*m* that stores the acquired state information Mi of the motor 24.

The state information Mi of the motor 24 is not particularly limited, and the state information Mi may include, for example, at least one of a supply voltage (voltage Em), a drive current, a rotational speed, a rotation position, vibration, and a temperature of the motor 24. The acquirer 136 of the present embodiment acquires the state information Mi from a detection result of a detector 134. The detector 134 of the present embodiment includes a voltage sensor 134*a* that detects a supply voltage of the motor 24, a current sensor 134*b* that detects a drive current of the motor 24, a speed sensor 134*c* that detects a speed of the motor 24, a vibration sensor 134*d* that detects vibration of the motor 24, and a temperature sensor 134*e* that detects a temperature of the motor 24.

The acquirer 136 of the present embodiment includes a voltage acquirer 136*a* that acquires the detection result of the voltage sensor 134*a*, a current acquirer 136*b* that acquires the detection result of the current sensor 134*b*, a speed acquirer 136*c* that acquires the detection result of the speed sensor 134*c*, a vibration acquirer 136*d* that acquires the detection result of the vibration sensor 134*d*, and a temperature acquirer 136*e* that acquires the detection result of the temperature sensor 134*e*.

The voltage sensor 134*a* detects the voltage Em of the motor 24 from a duty ratio thereof.

The current sensor 134*b* detects the drive current of the motor 24 as a voltage drop of a resistor (not illustrated, and may be referred to as a shunt resistor sometimes) connected in series with the motor 24.

The speed sensor 134*c* acquires the speed Vm (rotational speed) of the motor 24 according to the cycle and the frequency of the output signal of the encoder (Hall IC) mounted on the motor 24.

Since the door speed Vd is proportional to the speed Vm of the motor 24, the speed sensor 134*c* detects the door speed Vd.

The rotation position of the motor 24 can be acquired by counting the output signal of the encoder.

In this case, the rotation position of the motor 24 over a plurality of rotations can also be detected. The door position (stroke value Sd) corresponds to the rotation position of the motor 24, and can be acquired by counting the output signal of the encoder.

In the embodiment, the temperature sensor 134*e* may be a sensor built into the IPM that drives the motor 24. The IPM may have motor protection functions such as overheat protection, short-circuit protection, overcurrent protection, and control power supply abnormal protection.

The state information Mi may be acquired at all times. However, in this case, the amount of information to be acquired increases, the capacity of the storage 140*m* necessary for storing the information increases, and it is disadvantageous in terms of size and cost.

Thus, in the present embodiment, the state information Mi is acquired at a predetermined timing in each speed region. By doing so, the amount of information Mi is reduced, and thus, the capacity of the storage 140*m* can be suppressed.

The state information Mi may be acquired at a plurality of timings in each speed region. For example, the state information Mi may be acquired at a timing corresponding to an intermediate position of the predetermined stroke value Sd in each speed region and an expiration timing of each speed region. In this case, since the diagnosis is performed based on information at the plurality of timings, the accuracy of diagnosis of whether or not there is an abnormality and whether or not the maintenance is necessary can be improved. Since the state information Mi in the speed region is evaluated not at one point but at multiple points, various information regarding the motor 24 can be obtained such as a case where power consumption is obtained from voltages at the multiple points.

The maintenance support apparatus 140 of the present embodiment acquires the state information Mi at the expiration timing of each speed region. The expiration of the speed region may be a switching time between a plurality of speed regions.

The maintenance support apparatus 140 may acquire the state information Mi at each opening operation, may acquire the state information at the time of a predetermined event, or may acquire the state information at a predetermined time. In the present embodiment, the state information Mi is acquired at the time of a start-up inspection of the automatic door 100. For example, the state information Mi may be acquired when several test operations are performed by switching the automatic door in a non-operation state to a movable state. In this case, the influence of a temperature difference of the motor or the like due to a difference in an immediately previous operation situation can be reduced. When there is no non-operation state in continuous operations, the state information Mi may be acquired at a fixed time in a time zone in which an operation rate is low such as early morning. The acquisition operation of the state information Mi may be incorporated into a control sequence of the start-up inspection, and this acquisition operation may be automatically executed at the time of the start-up inspection.

The maintenance support apparatus 140 stores the acquired state information Mi in the storage 140*m*. The maintenance support apparatus 140 outputs the stored state information Mi to the specifier 150 to be described later via the communication means.

Next, a characteristic change when the component of the automatic door 100 deteriorates will be described before the specifier 150 is described.

Figure 11:
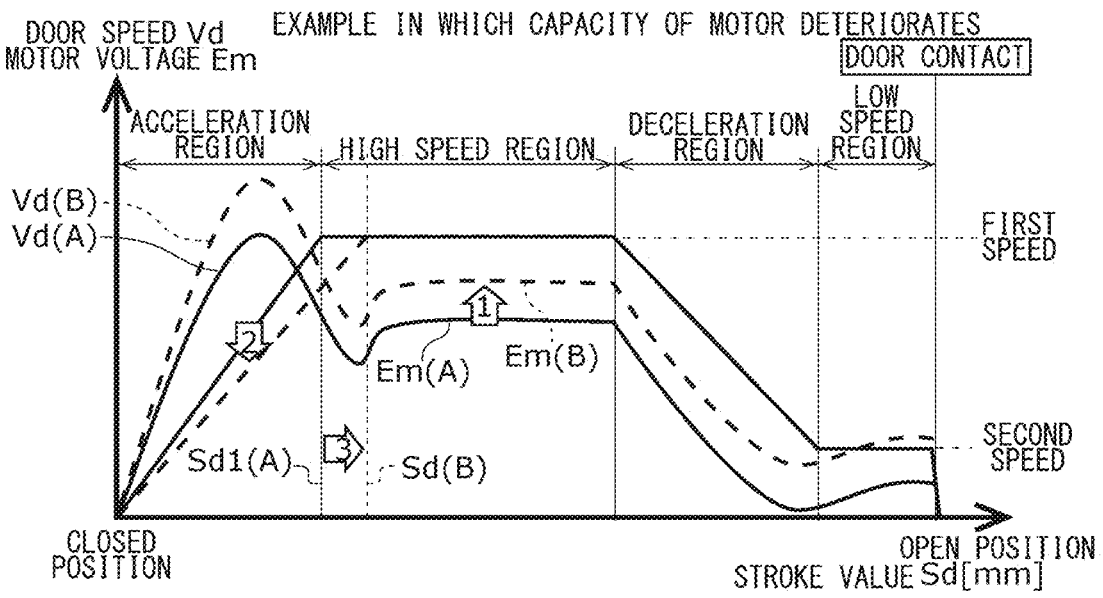
FIG. 11 is a diagram illustrating an example of a relationship between a stroke of an automatic door and a door speed of FIG. 9.

First, a characteristic change of the door speed Vd of the automatic door 100 when the motor 24 deteriorates and the capacity thereof decreases will be described with reference to FIG. 11. Demagnetization of a field magnet (not illustrated) is considered as deterioration in the capacity of the motor 24, and in this case, a torque constant (a ratio of the generated torque to the drive current) decreases. FIG. 11 is a graph representing the door speed Vd and the voltage Em with respect to a moving stroke Sd (hereinafter, referred to as a "stroke value Sd") from the closed position to the open position of the doors 12 in the opening operation. Solid lines in this graph indicate the door speed Vd(A) and the voltage Em(A) of the automatic door 100(A) in the initial state in which the motor 24 does not deteriorate. Dashed lines in this graph indicate the door speed Vd(B) and voltage Em(B) of the automatic door 100(B) in a state in which the capacity of the motor 24 deteriorates.

The following diagnosis can be performed from the graph of the stroke versus the speed and voltage of FIG. 11.

(1) Since the capacity of the motor 24 is low in the automatic door 100(B), the voltage Em(B) of the automatic door 100(B) in the high speed region is higher than the voltage Em(A) of the automatic door 100(A).

(2) Since the capacity of the motor 24 is low in the automatic door 100(B), the door speed Vd(B) of the automatic door 100(B) corresponding to the same stroke value Sd in the acceleration region is less than the door speed Vd (A) of the automatic door 100(A).

(3) Since the control until the end of the acceleration is not normal in the automatic door 100(B), the stroke value Sd(B) of the automatic door 100(B) at the end of the acceleration (when the speed reaches the first speed) is longer than the stroke value Sd(A) of the automatic door 100(A). It is possible to determine that the cause of this abnormal control is deterioration in the capacity of the motor 24.

As described above, according to the present embodiment, it is possible to diagnose the deteriorated state (deteriorated state) of the capacity of the motor 24 according to the state information Mi of the motor 24 such as the door speed Vd and the voltage Em in each speed region.

Figure 12:
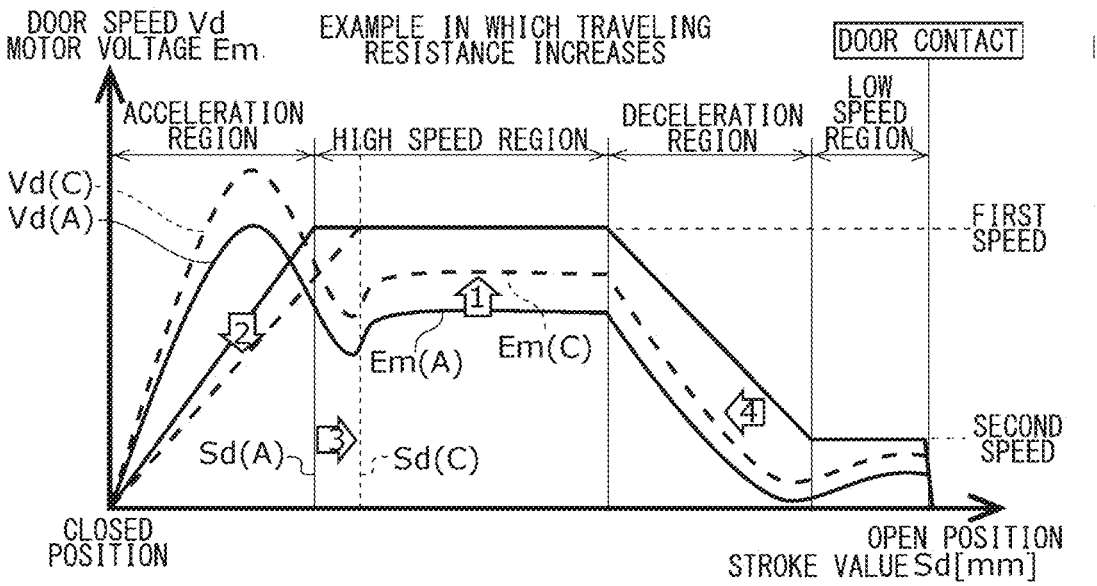
FIG. 12 is a diagram illustrating another example of the relationship between the stroke of the automatic door and the door speed of FIG. 9.

Next, the characteristic change of the door speed Vd of the automatic door 100 when a traveling resistance of the doors 12 increases due to the wear of the door rollers 22c or the like will be described with reference to FIG. 12. FIG. 12 is a graph representing the door speed Vd and the voltage Em with respect to the stroke value Sd of the doors 12 in the opening operation. Solid lines in this graph indicate the door speed Vd(A) and voltage Em(A) of the automatic door 100(A) in the initial state in which the door rollers 22c are not worn. Dashed lines in this graph indicate the door speed Vd(C) and voltage Em(C) of the automatic door 100(C) in the state in which the door rollers 22c are worn.

The following diagnosis can be performed from the graph of the stroke versus the speed and voltage of FIG. 12.

(1) Since the traveling resistance is high in the automatic door 100(C), the voltage Em(C) of the automatic door 100(C) in the acceleration region and the high speed region is higher than the voltage Em(A) of the automatic door 100(A).

(2) Since the traveling resistance is high in the automatic door 100(C), the door speed Vd(C) of the automatic door 100(C) corresponding to the same stroke value Sd in the acceleration region is lower than the door speed Vd (A) of the automatic door 100(A).

(3) Since the control until the end of the acceleration is not normal in the automatic door 100(C), the stroke value Sd(C) of the automatic door 100(C) at the end of the acceleration (when the speed reaches the first speed) is longer than the stroke value Sd(A) of the automatic door 100(A). It is possible to determine that the cause of this abnormal control is a high traveling resistance.

As described above, according to the present embodiment, it is possible to diagnose an increase in the traveling resistance due to the wear of the door rollers 22c or the like according to the state information Mi of the motor 24 such as the door speed Vd and the voltage Em in each speed region.

When FIGS. 11 and 12 are compared, there is a difference in the voltage Em in the deceleration region as indicated by an arrow 4 in FIG. 12. That is, when the capacity of the motor 24 deteriorates, the voltage Em(B) becomes significantly larger than the voltage Em(A) even in the deceleration region. Meanwhile, when the traveling resistance is high, since the door is also decelerated by the traveling resistance, the voltage Em(C) is smaller than the voltage Em(B) under a condition of a constant deceleration. Accordingly, in the present embodiment, it is possible to determine which component condition deteriorates depending on the magnitude of the voltage Em in the deceleration region.

Specifier

Next, the specifier 150 will be described with reference to FIGS. 9 and 10. The specifier 150 may be provided integrally with the controller 30 and the maintenance support apparatus 140, may be provided separately from the controller 30 and the maintenance support apparatus 140, or may be provided at a distance from the automatic door 100. The specifier 150 may be connected to the controller 30 and the maintenance support apparatus 140 by a data bus or via a communication network. The data bus or the network may be a wired or wireless manner. This communication network may be a public line or a dedicated line. The specifier 150 of the present embodiment is provided in a computer installed in the management center and connected to the maintenance support apparatus 140 via the communication network NW. In this case, one computer can support the maintenance of a plurality of automatic doors. The communication network NW may include the Internet.

The specifier 150 specifies state information Di of the automatic door 100 according to the state information Mi of the motor 24 in order to support the maintenance of the automatic door 100. The state information Di of the automatic door 100 is information regarding the state of the automatic door 100, and may be, for example, information regarding the maintenance of the automatic door 100. In the present embodiment, the state information Di of the automatic door 100 is information regarding the necessity for the maintenance such as whether or not the maintenance is necessary and the point in time at which the maintenance is to be performed. The specifier 150 of the present embodiment specifies the state information Di of the automatic door by comparing the state information Mi of the motor acquired by the acquirer 136 with the predetermined reference value Si. In this case, the state information Di of the automatic door 100 can be specified more accurately than in the case of simply diagnosing from the number of times of the opening and closing operation.

The specifier 150 includes a second storage 152 and a calculator 154. The second storage 152 stores the reference value Si, the acquired state information Mi of the motor 24, and the specified state information Di of the automatic door 100. The calculator 154 specifies the state information Di of the automatic door 100 according to the reference value Si and the state information Mi of the motor 24.

The reference value Si may be set according to state information of a motor of another automatic door having the same configuration as that of the automatic door 100. The reference value Si of the present embodiment is set for the automatic door 100 itself according to the state information Mi of the motor 24 acquired in the past. In this case, since the influence of an error caused by a manufacturing variation of the automatic door and a setting variation at the time of installation can be reduced, the accuracy of specification of the state information Di of the automatic door 100 can be improved.

As an example, the reference value Si may be set based on the state information Mi acquired when the doors 12 are opened a predetermined number of times (for example, 100 times or 1000 times) after the automatic door 100 is installed. In this case, since the operation such as an adjustment operation and a break-in operation is performed, it is hard to be influenced by mechanical familiarity at an initial stage.

The reference value Si of the present embodiment is set based on the state information Mi acquired during 100th to 300th opening operations after the installation. In this case, since the reference value Si is set at the time of confirming the operation after the installation, the reference value Si after the setting can also be confirmed at this time. The reference value Si may be set by an operation of an installation operator or may be set automatically. Such setting at an initial stage of installation may be referred to as initial setting of the reference value Si.

The state information Mi of the motor 24 may have temperature characteristics and is considered to fluctuate depending on the seasons such as summer and winter. There is a concern that the state information Mi fluctuates when parts or mechanisms are replaced in the maintenance or when a voltage of a commercial power supply fluctuates. It is considered that a margin at the time of diagnosis increases in consideration of such a fluctuation, but in this case, there is a concern that diagnosis accuracy deteriorates. Thus, the reference value Si of the present embodiment is updated for the automatic door 100 according to the state information Mi of the motor 24 acquired in the past. Such an update may be referred to as an update of the reference value Si.

The reference value Si of the present embodiment is updated according to a calendar such as the change of seasons. The reference value Si of the present embodiment is updated based on the 100th to 300th state information Mi from the maintenance. The reference value Si may be updated automatically, may be updated by the operator, or may be updated by an instruction from the outside such as a management center.

Next, an example of specifying the information (state information Di) regarding the necessity for the maintenance of the automatic door 100 by comparing the state information Mi of the motor 24 with the reference value Si will be described. The calculator 154 may calculate a difference between the acquired state information Mi of the motor 24 and the reference value Si stored in the second storage 152 (hereinafter, referred to as a "deviation"). The calculator 154 may calculate a ratio of the deviation to the reference value Si (hereinafter, referred to as a "deviation rate"). The specifier 150 may use the deviation rate as the state information Di.

The calculator 154 may classify the deviation rate based on one or a plurality of threshold values. The classification result of the deviation is used, and thus, the necessity of the maintenance of the automatic door 100 can be accurately diagnosed. For example, a first threshold value may be set to 10%, a second threshold value may be set to 20%, and a third threshold value may be set to 30%. In this case, the deviation may be classified into a rank 1 when the deviation rate is equal to or less than 10%, a rank 2 when the deviation rate is greater than 10% and is equal to or less than 20%, a rank 3 when the deviation rate is greater than 20% and is equal to or less than 30%, and a rank 4 when the deviation rate is greater than 30%. The specifier 150 may use, as the state information Di, the ranks as the classification result.

Degrees of necessity of the maintenance of the automatic door 100 may be set in advance according to the classification result. Hereinafter, an example of the degrees of necessity of the maintenance is illustrated. Rank 1: there is no necessity for part replacement. Rank 2: there is a low necessity for part replacement, but caution is required. Rank 3: there is a necessity for part replacement, and replacement within a predetermined period (for example, within half a year) is recommended. Rank 4: there is a high necessity for part replacement, and prompt replacement is recommended. The specifier 150 stores the specification result specified by the calculator 154 in the second storage 152. The stored specification result may include at least one of the deviation rate, the classification result, and the degrees of necessity for the maintenance.

Presenter

Next, the presenter 160 will be described. The presenter 160 presents the state information Di of the automatic door specified by the specifier 150. A case where the state information Di is presented may include at least one of a case where the state information Di is displayed, a case where the state information Di is printed, and a case where the state information Di is transmitted via the communication network NW. The presenter 160 of the present embodiment includes a liquid crystal display 160m that displays the state information Di and a portable display 160h capable of displaying the state information Di. The state information Di may be transmitted from the specifier 150 to the liquid crystal display 160m in a wired or wireless manner. The portable display 160h may be carried by a service technician. The state information Di may be transmitted from the specifier 150 to the portable display 160h via the communication network NW.

The state information Di is displayed on the liquid crystal display 160m, and thus, the operator can easily grasp the necessity for the maintenance for each automatic door 100. For example, in a maintenance, periodic inspection, or business scene, the necessity for the maintenance of the automatic door 100 can be easily grasped by displaying the state information Di on the portable display 160h carried by the service technician. In this case, since the service technician can promptly present the state information Di to a customer, it is possible to timely provide information by reducing a time loss. The state information Di is printed with the printer 160p, and thus, the explanation is simply presented to the customer.

The above description has been made based on the embodiments of the present invention. It will be appreciated by those skilled in the art that these embodiments are examples, various modifications and changes are possible within the claims of the invention, and such modification examples and change examples are also within the claims of the present invention. Accordingly, the descriptions and drawings in the present specification should be handled as being illustrative rather than restrictive.

Modification Example

Hereinafter, a modification example will be described. In the drawings and description of the modification example, the same or equivalent components and members as those of the embodiments are designated by the same reference signs. The descriptions overlapping with those of the embodiments will be appropriately omitted, and configurations different from those of the first embodiment will be mainly described.

Although it has been described in the description of the first embodiment that the specifier 42 specifies by using one threshold value, the present invention is not limited thereto. The specifier may provide maintenance information in which the state information is classified by using a plurality of threshold values.

Although it has been described in the description of the first embodiment that the state information Li is the motor current Id, the present invention is not limited thereto. For example, a torque sensor capable of detecting the torque of the motor 24 may be separately provided, and the state information Li may be the detection result of the torque sensor.

Although it has been described in the description of the first embodiment that the motor current Id is detected by using the shunt resistor, the present invention is not limited thereto. For example, the motor current Id may be detected by using the duty ratio of the motor voltage.

Although it has been described in the description of the first embodiment that the door speed Vd includes the acceleration control state, the first speed control state, the deceleration control state, and the second speed control state, the present invention is not limited thereto. For example, the door speed Vd may not include one or both of the deceleration control state and the second speed control state. In this case, the doors 12 may be configured to stop by coming into contact with the stopper in the first speed control state.

Although it has been described in the description of the first embodiment that the doors 12 move horizontally in the predetermined direction, the present invention is not limited thereto. The doors 12 may open or close a predetermined opening, and may rotate in a predetermined direction, for example.

Although it has been described in the description of the first embodiment that the doors 12 are driven by using the belt 14, the present invention is not limited thereto. The doors 12 may be driven by known drive means such as chains and sprockets, wires and pulleys, racks and pinions, and balls and screw nuts.

Although it has been described in the description of the first embodiment that the door speed Vd includes the acceleration region, the high speed region, the deceleration region, and the low speed region, the present invention is not limited thereto. For example, the door speed Vd may not include one or both of the deceleration region and the low speed region. In this case, the doors 12 may be configured to stop in the high speed region by coming into contact with the stopper.

Although it has been described in the description of the first embodiment that the detector 134 includes the voltage sensor 134*a*, the current sensor 134*b*, the speed sensor 134*c*, the vibration sensor 134*d*, and the temperature sensor 134*e*, the present invention is not limited thereto. The detector 134 may not include some of these sensors. The detector 134 may include another type of sensor in place of all of these sensors.

Although it has been described in the description of the first embodiment that the acquirer 136 includes the voltage acquirer 136*a*, the current acquirer 136*b*, the speed acquirer 136*c*, the vibration acquirer 136*d*, and the temperature acquirer 136*e*, the present invention is not limited thereto. The acquirer 136 may not include some of these acquirers. The acquirer 136 may include another type of acquirer in place of all of these acquirers.

The above-mentioned modification example has the same functions and effects as those of the first embodiment.

Any combination of the above-described embodiments and modification example is also useful as an embodiment of the present invention. The new embodiment generated by the combination has the effects of the combined embodiment and the modification example.

What is claimed is:

1. An automatic door apparatus comprising:
an opening and closing mechanism including a door;
an information processor structured to:
    acquire state information of a motor structured to drive the door in at least any one control state of an acceleration control state in which the door is accelerated to a predetermined first speed, a first speed control state in which the door is maintained at the first speed, a deceleration control state in which the door is decelerated to a second speed less than the first speed, and a second speed control state in which the door is maintained at the second speed;
    specify information regarding maintenance of the door by comparing the acquired state information of the motor with a predetermined reference value; and
    calculate a difference between the acquired state information of the motor and the predetermined reference value stored in a storage,
wherein the state information of the motor includes at least two states information of a voltage, a current, a rotational speed, vibration, and a temperature of the motor,
    wherein the reference value is set according to information regarding the state of the motor acquired after an opening and closing operation is performed by a predetermined number of times after the installation of the automatic door,
wherein the reference value is updated according to state information of the motor acquired in the past,
wherein the information processor is structured to acquire the state information of the motor structured to drive the door in the first speed control state in which the door is maintained at the first speed, and
wherein the information processor is structured to specify the information regarding the maintenance by using a threshold value set according to a combination of a weight of the door, an installation environment of the door and an area of a main surface of the door.

2. The automatic door apparatus according to claim 1, wherein the state information of the motor is acquired at a plurality of timings in at least any one control state of the acceleration control state, the first speed control state, the deceleration control state, and the second speed control state.

3. The automatic door apparatus according to claim 1, wherein the state information of the motor is acquired at the time of switching between the acceleration control state, the first speed control state, the deceleration control state, and the second speed control state.

4. The automatic door apparatus according to claim 1, further comprising:
a presenter structured to present a specified state of the door.

5. The automatic door apparatus according to claim 1, wherein the information processor is structured to classify the acquired state information of the motor based on a threshold value.

6. The automatic door apparatus according to claim 1, wherein the predetermined reference value is set according to state information of the motor acquired previously.

7. The automatic door apparatus according to claim 1, wherein the information processor is structured to estimate a point in time at which the maintenance is to be performed based on an opening and closing frequency of the door.

8. The automatic door apparatus according to claim 7, wherein the opening and closing frequency is updated at a predetermined interval.

9. The automatic door apparatus according to claim 1, wherein the information processor is structured to evaluate a fluctuation in the state information of the motor.

10. The automatic door apparatus according to claim 1, wherein the information processor is structured to acquire the state information of the motor in the second speed control state in which the door is maintained at the second speed less than the first speed.

11. The automatic door apparatus according to claim 1, wherein the state information of the motor is information regarding a current flowing through the motor.

12. The automatic door apparatus according to claim 1, wherein the information processor is structured to acquire the state information of the motor in the deceleration control state.

13. The automatic door apparatus according to claim 1, further comprising:
a presenter structured to present a specification result of the information processor, wherein the presenter is disposed near the door.

14. The automatic door apparatus according to claim 1, wherein the information processor is structured to output a specification result of the information processor.

15. The automatic door apparatus according to claim 1, further comprising:

a transmitter structured to transmit an acquisition result of the information processor to a cloud server, wherein the information processor is provided at the automatic door, near the automatic door, or in the cloud server.

16. The automatic door apparatus according to claim 1, wherein the information processor classifies a deviation rate based on one or a plurality of threshold values.

17. The automatic door apparatus according to claim 1, wherein degrees of necessity of the maintenance of the door is set in advance according to a classification result.

18. An automatic door maintenance support apparatus, comprising:

an opening and closing mechanism including a door;

an information processor structured to:

acquire state information of a motor structured to drive the door in at least any one control state of an acceleration control state in which the door is accelerated to a predetermined first speed, a first speed control state in which the door is maintained at the first speed, a deceleration control state in which the door is decelerated to a second speed less than the first speed, and a second speed control state in which the door is maintained at the second speed;

specify information regarding maintenance of the door by comparing the acquired state information of the motor with a predetermined reference value;

calculate a difference between the acquired state information of the motor and the predetermined reference value stored in a storage; and output the acquired state information of the motor, wherein the state information of the motor includes at least two states information of a voltage, a current, a rotational speed, vibration, and a temperature of the motor, wherein the reference value is set according to information regarding the state of the motor acquired after an opening and closing operation is performed by a predetermined number of times after the installation of the automatic door, wherein the reference value is updated according to state information of the motor acquired in the past, wherein the information processor is structured to acquire the state information of the motor structured to drive the door in the first speed control state in which the door is maintained at the first speed, and wherein the information processor is structured to specify the information regarding the maintenance by using a threshold value set according to a combination of a weight of the door, an installation environment of the door and an area of a main surface of the door.

19. An automatic door maintenance support method comprising:

providing an opening and closing mechanism including a door of an automatic door;

acquiring state information of a motor structured to drive the door of the automatic door in at least any one control state of an acceleration control state in which the door is accelerated to a predetermined first speed, a first speed control state in which the door is maintained at the first speed, a deceleration control state in which the door is decelerated to a second speed less than the first speed, and a second speed control state in which the door is maintained at the second speed; and specifying information regarding maintenance of the automatic door by comparing the acquired state information of the motor with a predetermined reference value; and calculating a difference between the acquired state information of the motor and the predetermined reference value stored in a storage, wherein the state information of the motor includes at least two states information of a voltage, a current, a rotational speed, vibration, and a temperature of the motor, wherein the reference value is set according to information regarding the state of the motor acquired after an opening and closing operation is performed by a predetermined number of times after the installation of the automatic door, wherein the reference value is updated according to state information of the motor acquired in the past, and wherein the method further includes:

acquiring the state information of the motor structured to drive the door in the first speed control state in which the door is maintained at the first speed, and specifying the information regarding the maintenance by using a threshold value set according to a combination of a weight of the door, an installation environment of the door and an area of a main surface of the door.

20. An automatic door maintenance support method comprising:

providing an opening and closing mechanism including a door of an automatic door;

a process of monitoring a behavior of an electrical value regarding a motor structured to drive the door of the automatic door and acquiring state information of a motor in at least any one control state of an acceleration control state in which the door is accelerated to a predetermined first speed, a first speed control state in which the door is maintained at the first speed, a deceleration control state in which the door is decelerated to a second speed less than the first speed, and a second speed control state in which the door is maintained at the second speed;

a process of specifying information regarding maintenance of the automatic door by comparing the acquired state information of the motor with a predetermined reference value based on the behavior; and a process of calculating a difference between the acquired state information of the motor and the predetermined reference value stored in a storage, wherein the state information of the motor includes at least two states information of a voltage, a current, a rotational speed, vibration, and a temperature of the motor, wherein the reference value is set according to information regarding the state of the motor acquired after an opening and closing operation is performed by a predetermined number of times after the installation of the automatic door, wherein the reference value is updated according to state information of the motor acquired in the past, and wherein the method further includes:

acquiring the state information of the motor structured to drive the door in the first speed control state in which the door is maintained at the first speed, and specifying the information regarding the maintenance by using a threshold value set according to a combination of a weight of the door, an installation environment of the door and an area of a main surface of the door.

* * * * *